US012775033B2

(12) United States Patent
Holland et al.

(10) Patent No.: US 12,775,033 B2
(45) Date of Patent: Oct. 27, 2026

(54) SYSTEMS AND METHODS FOR MONITORING IMPEDANCE OF AN ELECTRICAL CONNECTION DEVICE

(71) Applicant: Analog Devices International Unlimited Company, Limerick (IE)

(72) Inventors: William Michael James Holland, Edinburgh (GB); Jonathan Ephraim David Hurwitz, Edinburgh (GB); John David Stuart, Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 184 days.

(21) Appl. No.: 18/437,413

(22) Filed: Feb. 9, 2024

(65) Prior Publication Data

US 2024/0280619 A1 Aug. 22, 2024

Related U.S. Application Data

(60) Provisional application No. 63/446,754, filed on Feb. 17, 2023.

(51) Int. Cl.
*G01R 27/02* (2006.01)
*G01R 19/165* (2006.01)
*H02H 3/08* (2006.01)

(52) U.S. Cl.
CPC ....... *G01R 27/02* (2013.01); *G01R 19/16533* (2013.01); *H02H 3/08* (2013.01)

(58) Field of Classification Search
CPC .......................... G01R 27/02; G01R 19/16533
See application file for complete search history.

(56) References Cited

U.S. PATENT DOCUMENTS 6,522,033 B1 2/2003 Nevo
7,265,555 B2 9/2007 Batten et al.
(Continued)

FOREIGN PATENT DOCUMENTS

CN 208520923 2/2019

OTHER PUBLICATIONS

Office Action for Great Britain Patent Application No. GB2516668.7, mailed Nov. 6, 2025, 5 pages.
(Continued)

*Primary Examiner* — Walter L Lindsay, Jr.
*Assistant Examiner* — Milton Gonzalez
(74) *Attorney, Agent, or Firm* — DLA Piper LLP (US)

(57) ABSTRACT

A system for monitoring impedance of an electrical connection device includes a first connection port, a second connection port, a first impedance element, an analog-to-digital converter (ADC), clamping circuitry, and processing subsystem. The first connection port is configured to be electrically coupled to a first side of the electrical connection device, and the second connection port is configured to be electrically coupled to a second side of the electrical connection device. The ADC includes a first input port and a second input port. The first input port is electrically coupled to the first connection port, and the second input port is electrically coupled to the second connection port via the first impedance element. The clamping circuitry is electrically coupled to at least one of the first input port and the second input port. The processing subsystem is configured to determine impedance of the electrical connection device.

11 Claims, 22 Drawing Sheets

(56) References Cited

U.S. PATENT DOCUMENTS

| | | | | |
|---|---|---|---|---|
| 11,675,011 | B2 | 6/2023 | Danesh et al. | |
| 2016/0169945 | A1 | 6/2016 | Mauder et al. | |
| 2017/0254842 | A1 | 9/2017 | Bahl et al. | |
| 2019/0072604 | A1 * | 3/2019 | Huerlimann | G01R 31/3277 |
| 2021/0048478 | A1 | 2/2021 | Danesh et al. | |
| 2023/0268153 | A1 * | 8/2023 | Gopalan | H01H 47/002 |

OTHER PUBLICATIONS

Frost, "Mass parametric acquisition of relay contact data during high-speed life test," 2014 IEEE 60th Holm Conference on Electrical Contacts (Holm), 2014, 7 pages.
Texas Instruments Incorporated, "Ultra-Low Noise, Precision Operational Amplifiers," OPA27 and OPA37 Data Sheet, Burr-Brown Products from Texas Instruments, Jan. 1984, 24 pages.
Analog Devices Inc., "Low Power, 1 nV/√Hz, G ≥ 10 Stable, Railto-Rail Output Amplifier," ADA4895-1/ADA4895-2 Data Sheet, Dec. 31, 2015, 24 pages.
Examination Report from GB Application No. 2402033.1, dated Jan. 27, 2025, 12 pages.

* cited by examiner

SYSTEMS AND METHODS FOR MONITORING IMPEDANCE OF AN ELECTRICAL CONNECTION DEVICE

RELATED APPLICATIONS

This application claims benefit of U.S. Provisional Patent Application No. 63/446,754, filed on Feb. 17, 2023, which is incorporated herein by reference.

BACKGROUND

Electrical connection devices, such as switches or plugs and socket assemblies, exhibit impedance, such as resistance. Impedance of an electrical connection device may increase over time, such as due to heating of the electrical connection device, exposure to overcurrent events such as surge or short circuits, arcing across the electrical connection device, exposure of the electrical connection device to environment elements, e.g., humidity, and/or mechanical degradation of the electrical connection device. For example, a switch within a circuit breaker may degrade and exhibit an increased impedance over its lifetime, such as from heating or other environmental factors, from breaking a current having a large magnitude, making when there is a short, and/or making when there is a high voltage. As another example, a plug and socket assembly of electrical vehicle supply equipment (EVSE) may mechanically degrade from being subjected to a large number of insertions and removals, thereby causing the plug and socket assembly to exhibit an increase in impedance. Increase in impedance of an electrical connection device is typically undesirable. For example, an increase in impedance of a switch within a circuit breaker may cause excessive heating of the circuit breaker, resulting in circuit breaker failure or improper circuit breaker operation, such as false tripping or failing to trip.

DETAILED DESCRIPTION OF THE EMBODIMENTS

Disclosed herein are new systems and methods for monitoring impedance of an electrical connection device. Particular embodiments are tolerant of high voltages which may be present across an electrical connection device when the device is open, and certain embodiments exhibit low leakage current. Additionally, the new systems and methods are capable of providing a digital signal representing impedance of an electrical connection device, thereby enabling detection of an increase in impedance of the electrical connection device, such as to predict upcoming failure and/or improper operation of the electrical connection device. Possible applications of the new systems and methods include, but are not limited to, monitoring impedance of a switch within a circuit breaker and/or monitoring impedance of a plug and socket combination of electrical vehicle supply equipment (EVSE). In this document, an “electrical connection device” is any device which is capable of electrically coupling two or more electrical nodes. An electrical connection device may be configured to selectively electrically couple two or more electrical nodes, or an electrical connection device may be configured to permanently electrically couple two or more electrical nodes.

Figure 1:
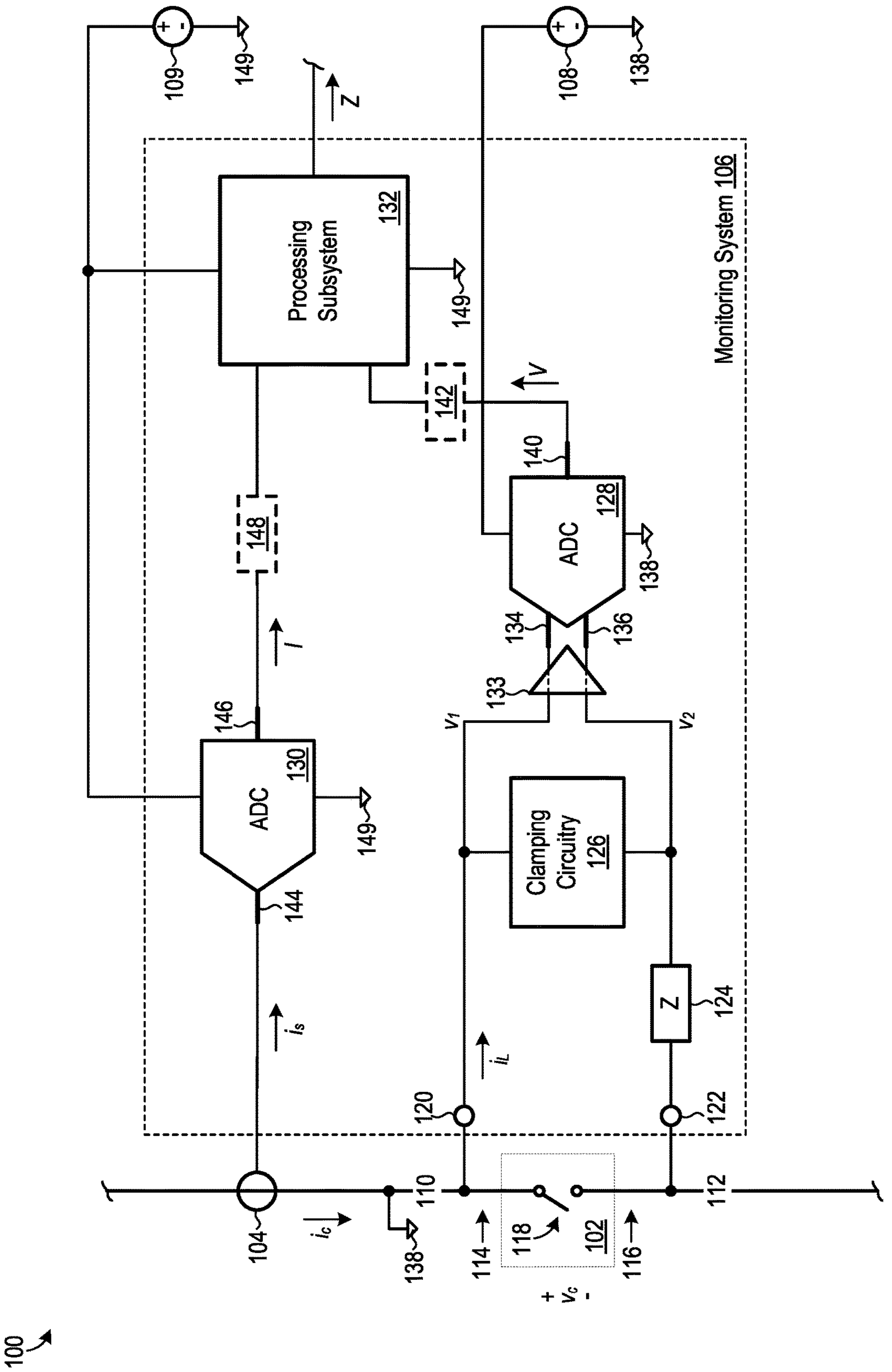
FIG. 1 is a schematic diagram of an electrical environment including a monitoring system, according to an embodiment.

FIG. 1 is a schematic diagram of an electrical environment 100 including an electrical connection device 102, a current sensor 104, a monitoring system 106, a power supply 108, and a power supply 109, where monitoring system 106 is one embodiment of the new systems for monitoring impedance of an electrical connection device disclosed herein. As discussed further below, monitoring system 106 is configured to generate a signal Z representing impedance, e.g., resistance, capacitance, and/or inductance, of electrical connection device 102. Electrical connection device 102 is electrically coupled between a first power node 110 and a second power node 112. Specifically, a first side 114 of electrical connection device 102 is electrically coupled to first power node 110, and a second side 116 of electrical connection device 102 is electrically coupled to second power node 112. In some embodiments, a load (not shown) is electrically coupled to second power node 112. Electrical connection device 102 is embodied by a switch 118 in the FIG. 1 embodiment. Electrical connection device 102 is configured to (a) electrically couple first power node 110 and second power node 112 when electrical connection device 102 is "closed," e.g., when switch 118 is closed, and (b) electrically isolate first power node 110 and second power node 112 from each other when electrical connection device 102 is "open," e.g., when switch 118 is open.

Figure 2:
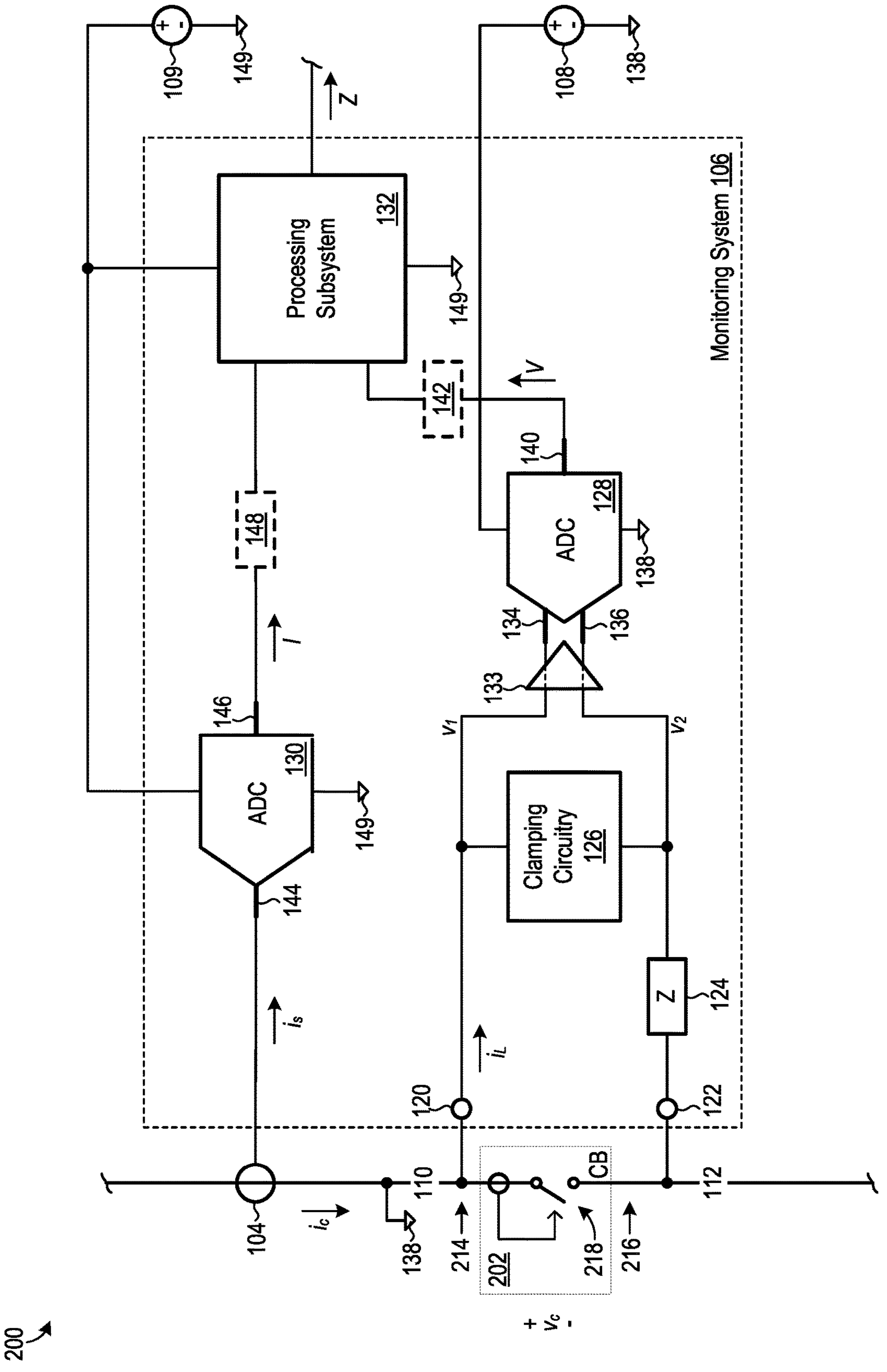
FIG. 2 is a schematic diagram of an embodiment of the FIG. 1 electrical environment where an electrical connection device is embodied by a circuit breaker.

In certain embodiments, switch 118 is a switch of a circuit breaker (CB), a switch of a circuit breaker within a consumer unit, a switch of a residual-current device (RCD), a switch of a ground fault circuit interrupter (GFCI), a switch of an arc fault circuit interrupter (AFCI), a switch of a contactor, a switch of a contactor in series with batteries in an electrical vehicle, a switch of switchgear (including, but not limited to medium voltage switchgear and high voltage switchgear), or a disconnect relay of a meter. For example, FIG. 2 is a schematic diagram of an electrical environment 200, which is an embodiment of electrical environment 100 where electrical connection device 102 is embodied by a circuit breaker 202. In certain embodiments, circuit breaker 202 is a molded case circuit breaker (MCCB), an air circuit breaker (ACB), or a miniature circuit break (MCB). Circuit breaker 202 includes a switch 218, which is an embodiment of switch 118 of FIG. 1. As symbolically illustrated in FIG. 2, switch 218 is configured to open in response to magnitude of current $i_c$ flowing through switch 218 crossing (e.g., exceeding) a threshold value, such as in response to an overcurrent condition in electrical environment 200 or a short circuit condition in electrical environment 200. Equally, switch 218 could be configured to open because of detection of a short circuit, detection of a ground fault, detection of an arc fault, or just because it has been asked to open to cut a connection. A first side 214 of circuit breaker 202 is electrically coupled to first power node 110, and a second side 216 of circuit breaker 202 is electrically coupled to second power node 112. In certain embodiments, circuit breaker 202 is rated at (a) less than one ampere, (b) greater than one ampere, (c) greater than 10 amperes, (d) greater than 100 amperes, (e) greater than 1,000 amperes, or (f) not rated at any particular current magnitude.

Figure 3:
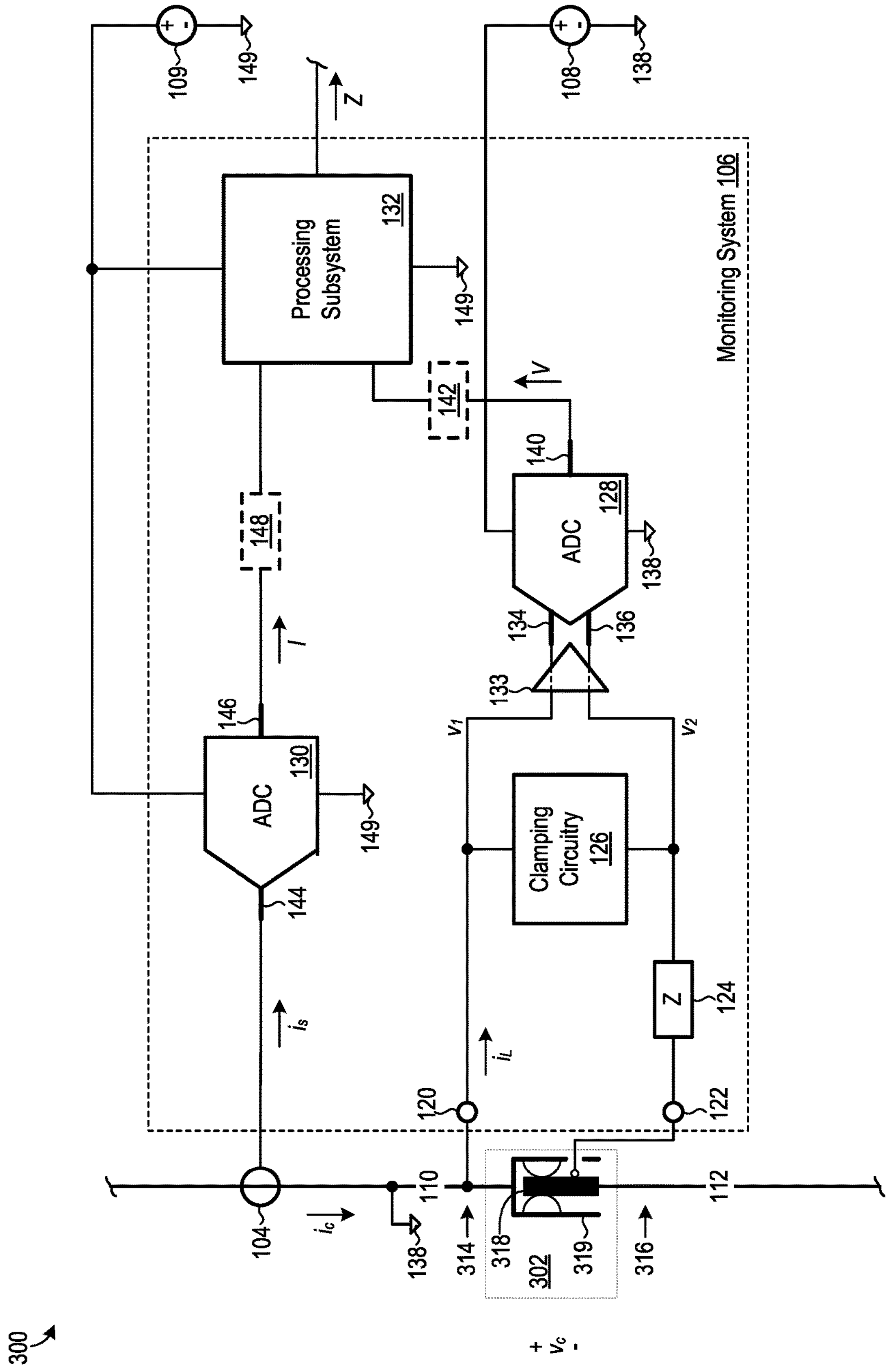
FIG. 3 is a schematic diagram of an embodiment of the FIG. 1 electrical environment where an electrical connection device is embodied by a plug and socket assembly.

Referring again to FIG. 1, electrical connection device 102 could be replaced with an alternative device configured to selectively electrically couple first power node 110 and second power node 112, or even with a device that is configured to permanently electrically coupled first power node 110 and second power node 112, such as an electrical cable subject to increase in impedance over its lifetime, a contact in connection terminals carrying power, or a tap point on a multi-tap transformer. For example, FIG. 3 is a schematic diagram of an electrical environment 300, which is an embodiment of electrical environment 100 where electrical connection device 102 is embodied by a plug and socket assembly 302 including a plug 318 and a socket 319. In certain embodiments, plug and socket assembly 302 is part of EVSE (not shown). Socket 319 is part of a first side 314 of plug and socket assembly 302, which is electrically coupled to first power node 110. Plug 318 is part of a second side 316 of plug and socket assembly 302, which is electrically coupled to second power node 112. Plug and socket assembly 302 is closed when plug 318 is inserted into socket 319, and plug and socket assembly 302 is open when plug 318 is removed (not shown) from socket 319.

Referring again to FIG. 1, monitoring system 106 includes a first connection port 120, a second connection port 122, an impedance element 124, clamping circuitry 126, an analog-to-digital converter (ADC) 128, an ADC 130, a processing subsystem 132, and a buffer 133. Two or more elements of monitoring system 106 could be combined without departing from the scope hereof. Additionally, ADC 130 and/or processing subsystem 132 could be external to monitoring system 106, instead of being part of monitoring system 106. Additionally, current sensor 104 and/or power supply 108 could be part of monitoring system 106, instead of being external to monitoring system 106.

First connection port 120 is electrically coupled to first side 114 of electrical connection device 102 at first power node 110, and second connection port 122 is electrically coupled to second side 116 of electrical connection device 102 at second power node 112. In some embodiments, each of first connection port 120 and second connection port 122 is embodied by an electrical terminal or an electrical conductor, such as a wire, a printed circuit board (PCB) trace, or an integrated circuit (IC) pin, tab, or solder bump. In electrical environment 300 (FIG. 3), second connection port 122 is electrically coupled to second side 316 of plug and socket assembly 302 via a kelvin connection with plug 318.

Referring again to FIG. 1, a first input port 134 of ADC 128 is electrically coupled to first connection port 120 via buffer 133, and a second input port 136 of ADC 128 is electrically coupled to second connection port 122 via buffer 133 and impedance element 124, such that impedance element 124 is electrically coupled in series between (a) second connection port 122 and (b) each of clamping circuitry 126 and buffer 133. Buffer 133 includes, for example, one or more transistors, such as field effect transistors, configured as a buffer or as a voltage amplifier. Buffer 133 buffer may advantageously increase effective input impedance of ADC 128 and/or amplify an signal to ADC 128. Buffer 133 could be omitted, or buffer 133 could be replaced with an asymmetrical buffer configured to buffer only one of first input port 134 of ADC 128 or second input port 136 of ADC 128. Additionally, buffer 133 could be integrated within ADC 128 without departing from the scope hereof.

Impedance element 124 is configured to help minimize flow of leakage current $i_L$, i.e., electric current flowing from first connection port 120 to second connection port 122, such as to prevent material flow of leakage current $i_L$ when electrical connection device 102 is open. Additionally, impedance element 124 helps protect ADC 128 and buffer

133 from damage in response to electrical connection device 102 opening. In certain embodiments, impedance element 124 is configured to have a sufficiently large impedance such that magnitude of leakage current $i_L$ does not exceed 0.5 milliamperes (mA), 100 microamperes (μA), 50 μA, or another predetermined maximum value, when a voltage $v_c$ across electrical connection device is at 110% of its maximum rated value when electrical connection device 102 is open. In certain embodiment, impedance element 124 has a resistance of at least one megaohm (MOhm), or a capacitance of less than 20 nanoFarad (nF), when electrical connection device 102 is open.

Clamping circuitry 126 is electrically coupled to first input port 134 of ADC 128 via buffer 133 and/or to second input port 136 of ADC 128 via buffer 133. While FIG. 1 depicts clamping circuitry as being electrically coupled to each of first input port 134 and second input port 136 via buffer 133, certain embodiments of clamping circuitry 126, e.g., an embodiment discussed below with respect to FIG. 9, need only be electrically coupled to one input port of ADC 128. Particular embodiments of ADC 128 and/or buffer 133 may be damaged when subjected to rated value of voltage $v_c$ across electrical connection device 102 when electrical connection device 102 is open. Accordingly, clamping circuitry 126 is configured to limit magnitude of voltage between first input port 134 and second input port 136, to prevent possible damage to ADC 128 and/or buffer 133 when electrical connection device 102 is open. Additionally, clamping circuitry 126 is configured to limit magnitude of voltage at first input port 134 and second input port 136 with respect to a reference node 138 or a power supply rail of ADC 128. It is desired that clamping circuitry 126 exhibit a low capacitance, e.g., a capacitance of less than one nF, to prevent clamping circuitry 126 and impedance element 124 from forming a low-pass filter which undesirably filters high frequency signals required to monitor impedance of electrical connection device 102. Additionally, clamping circuitry 126 is typically configured to draw minimal current when electrical connection device 102 is closed.

Figure 4:
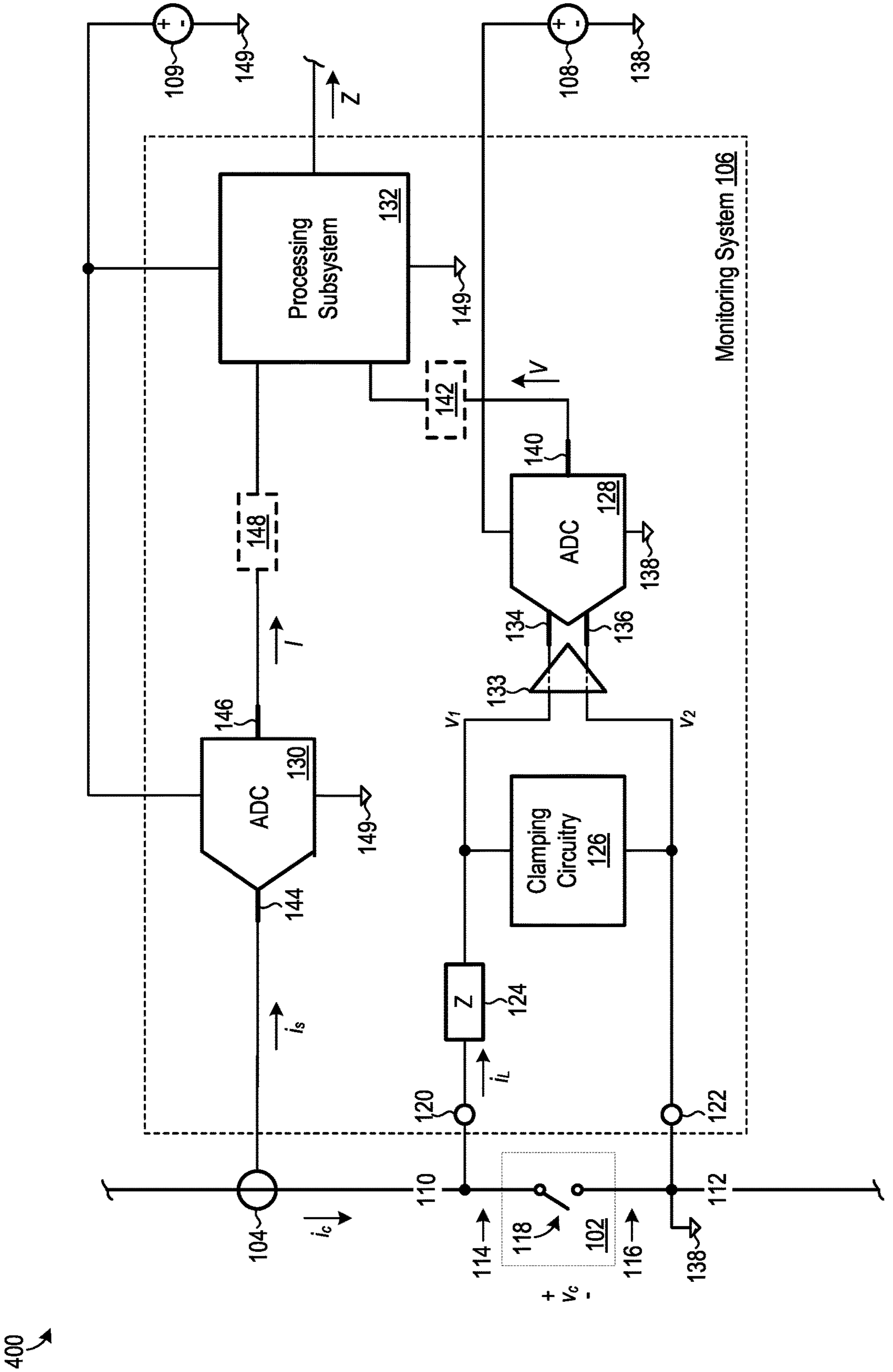
FIG. 4 is a schematic diagram of an alternate embodiment of the FIG. 1 electrical environment with a reference node is moved to a second side of an electrical connection device.

ADC 128 is at least partially powered by power supply 108. Each of power supply 108 and ADC 128 are referenced to a common reference node 138. Reference nodes in the drawings are represented by downward pointing triangles. It should be noted that reference node 138 is the same electrical node as first power node 110, and each of power supply 108 and ADC 128 and buffer 133 is therefore referenced to first power node 110. In an alternate embodiment, reference node 138 is the same electrical node as second power node 112, such that each of power supply 108 and ADC 128 is referenced to second power node 112, instead of to first power node 110. For example, FIG. 4 is a schematic diagram of an electrical environment 400, which is an alternate embodiment of electrical environment 100 (FIG. 1) where reference node 138 is the same electrical node as second power node 112. Impedance element 124 is moved to be electrically coupled in series with first connection port 120, instead of with second connection port 122, due to reference node 138 being the same as second power node 112.

FIG. 1 depicts ADC 130 and processing subsystem 132, discussed further below, being powered by power supply 109 and referenced to a reference node 149, where reference node 149 is a different electrical node that reference node 138. Reference node 149 is, for example, earth ground, a chassis ground, or an electrical node that is at a different electrical potential than either earth ground or a chassis ground, such that reference node 149 is “floating” with respect to earth ground or chassis ground. In an alternate embodiment, reference node 138 and reference node 149 are a common electrical node. In applications where electrical environment 100 includes a 3-phase electrical topology or multiple electrical connection devices monitored by a plurality of respective monitoring system 106 instances, it may be advantageous for processing subsystem 132 to be powered by a dedicated power supply (not shown) so that processing subsystem 132 can be common to several monitoring systems that are each referenced to their own reference node, such as discussed below with respect to FIG. 18.

ADC 128 has a high input impedance, i.e., impedance seen when measured across first input port 134 and second input port 136. For example, certain embodiments of ADC 128 have an input impedance of at least 400 kilohms (kOhms) or at least 4000 kOhms. Additionally, buffer 133 may increase effective input impedance of ADC 128. Furthermore, clamping circuitry 126 is typically configured to draw minimal current when electrical connection device 102 is closed, as discussed above. Consequently, a magnitude of leakage current $i_L$ is small when electrical connection device 102 is closed, and difference between a voltage $v_1$ at first input port 134 of ADC 128 and a voltage $v_2$ at second input port 136 of ADC 128 is therefore an attenuated version of voltage $v_c$ across electrical connection device 102 when electrical connection device 102 is closed. ADC 128 samples voltage across first input port 134 and second input port 136 and generates a digital signal V representing voltage $v_c$ across electrical connection device 102 when electrical connection device 102 is closed. A relation between voltage $v_c$ and voltage sampled by ADC 128 via buffer 133, or voltage directly sampled by ADC 128 in embodiments where buffer 133 is omitted, may be expressed as a divide ratio (DR) defined as follows: $DR=[v_c/(v_1-v_2)]$. Accordingly, the divide ratio represents attenuation of voltage $v_c$ as sampled by ADC 128 for generating digital signal V. In particular embodiments, monitoring system 106 is configured, e.g., by selecting impedance of impedance element 124, such that the divide ratio is less than 1,000, less than 100, less than 10, or even smaller, to help minimize attenuation of voltage $v_c$ and thereby facilitate measuring $v_c$ when electrical connection device 102 is closed and magnitude of voltage $v_c$ is typically small.

Digital signal V is communicatively coupled to processing subsystem 132. Isolation device 142 is electrically coupled between output port 140 of ADC 128 and processing subsystem 132 in view of ADC 128 and processing subsystem 132 being referenced to different reference nodes 138 and 149, respectively. Isolation device 142 converts digital signal V from ADC 128 to a form compatible with processing subsystem 132. In certain embodiments, isolation device 142 includes one or more of a capacitive isolation device, an optical isolation device, a transformer isolation device, and a radio frequency (RF) wireless isolation device. Isolation device 142 may be omitted in alternate embodiments where ADC 128 and processing subsystem 132 are referenced to a common reference node. Additionally, isolation device 142 may be omitted in embodiments where ADC 128 is an isolating ADC such that a “front end” of ADC 128 including first input port 134 and second input port 136 is isolated from a “back end” of ADC 128 including output port 140. Power supply 108 may be integrated in ADC 128 in embodiments where ADC 128 is an isolating ADC. Examples of possible isolating ADCs include, but are not limited to, the Analog Devices ADE7932 ADC.

In an alternate embodiment, buffer 133 are replaced with, or supplemented by, an isolation amplifier configured to sense a difference between voltage $v_1$ and voltage $v_2$ and generate an isolated analog signal representing a difference between the two voltages.

Current sensor 104 is configured to generate a signal $i_s$ representing magnitude of current $i_c$ flowing through electrical connection device 102. Signal $i_s$ is, for example, in the form of an electrical current or an electrical voltage. In certain embodiments, current sensor 104 is a current transformer, a di/dt sensor such as a Rogowski coil, a magnetic field sensor, such as a hall sensor or a magneto-resistive device, which are all capable of being galvanically isolated, or a shunt resistor. Current transformers and di/dt sensors are good for alternating (AC) current measurements, and magnetic field and shunt resistors are good for both AC and DC currents, and all have different characteristics in terms of maximum allowable current, bandwidth, noise, drift, and cost. Current sensor 104, and its associated electronics, e.g., ADC 130, could alternately be part of another system, such as an energy meter or a control system for a charger, and report data to processing subsystem 132. Additionally, analog signal $i_s$ and/or digital signal I could be used by processing subsystem 132, or another element internal or external to monitoring system 106, to provide one or more other functions such as short circuit detection, overcurrent detection, and/or energy or power monitoring and/or measurement. For example, analog signal $i_s$ and/or digital signal I could be combined with a measurement of phase of current $i_c$, measurement of magnitude of voltage $v_c$, measurement of phase of voltage $v_c$, harmonic analysis of current $i_c$, and/or harmonic analysis of voltage $v_c$, to monitor and/or measure energy, power, or a related parameter, such as power factor (PF). This resource sharing facilitates implementation of monitoring system 106 in a multifunction device and can thereby minimize incremental cost and size associated with adding monitoring impedance capability to the device.

ADC 130 receives an signal $i_s$ at an input port 144 of ADC 130, and ADC 130 generates a digital signal I from a sampled value of analog signal $i_s$. Accordingly, digital signal I represents magnitude of current $i_c$ flowing through electrical connection device 102. In an alternate embodiment, ADC 130 is integrated in current sensor 104. Some embodiments of monitoring subsystem 106 further include a buffer (not shown) electrically coupled to input port 144. Digital signal I is communicatively coupled to processing subsystem 132. An optional isolation device 148 is electrically coupled between output port 146 of ADC 130 and processing subsystem 132 when digital signal I, as outputted by ADC 130, is not electrically compatible with processing subsystem 132, such as in alternate embodiments where (a) ADC 130 is referenced to a different reference node than processing subsystem 132 and (b) current sensor 104 is non-galvanic. Isolation device 148 is analogous to isolation device 142, and isolation device 148 accordingly converts digital signal I from ADC 130 to a form compatible with processing subsystem 132. Certain embodiments of monitoring system 106 are capable of processing analog signal $i_s$, or digital signal I, such that the signal linearly represents current $i_c$, and/or such that the signal matches phase, frequency, and/or magnitude of current $i_c$.

Processing subsystem 132 is configured to generate a digital signal Z representing impedance, e.g., resistance, capacitance, and/or inductance, of electrical connection device 102, such as by dividing digital signal V by digital signal I. In certain embodiments, digital signals V and I respectively represent real values of voltage and current, and digital signal Z represents a real value of impedance of electrical connection device 102, i.e. resistance of electrical connection device 102. In certain other embodiments, digital signals V and I respectively represent complex values of voltage and current, and digital signal Z represents a complex value of impedance of electrical connection device 102, i.e. capacitance/inductance of electrical connection device 102 along with resistance of electrical connection device 102. In certain embodiments, processing subsystem 132 generates digital signal Z only using portions of digital signal I, and/or using only portions of digital V, e.g., using only portions of the digital signals with a magnitude exceeding a predetermined value. Additionally, in particular embodiments, processing subsystem 132 generates digital signal Z only when certain predetermined conditions are met, such as when current time is within a predetermined time window or when frequency of digital signal I and/or digital signal V is within a predetermined frequency range. Additionally, some embodiments of processing subsystem 132 are configured to continuously generate digital signal Z or to periodically generate digital signal Z.

In certain embodiments, processing subsystem 132 is embodied by a digital signal processor (DSP). In certain other embodiments, processing subsystem 132 is embodied by one or more general purpose processors executing instructions, e.g., software and/or firmware, stored in a data store. However, processing subsystem 132 could take other forms without departing from the scope hereof Additionally, in some alternate embodiments, processing subsystem 132 is partially or fully implemented by one or more processing devices external to monitoring system 106. Digital signal Z is used, for example, to identify an increase in impedance of electrical connection device 102, such as to predict upcoming failure and/or improper operation of electrical connection device 102.

Certain embodiments of monitoring system 106 are advantageously capable of resolving an absolute value of resistance of electrical connection device 102, or a change in resistance of electrical connection device 102, as low as 100 microohm (μOhm), as low as 10 μOhm, or even lower. In many applications, the absolute value may not need to be exact or in an SI unit, as long as the change in its value can be expressed during the operation of monitoring system 106. Additionally, particular embodiments of monitoring system 106 are capable of monitoring impedance of electrical connection device 102 at low magnitudes of current $i_c$, e.g., as low as ten amperes, as low as one ampere, or even lower. It is advantageous to monitor the impedance at a current level that is significantly lower than the rated maximum operation of electrical connection device 102, as this allows monitoring when it is away from its peak operation, and it is anticipated that electrical connection device 102 will typically operate below its rated current in many applications.

Figure 5:
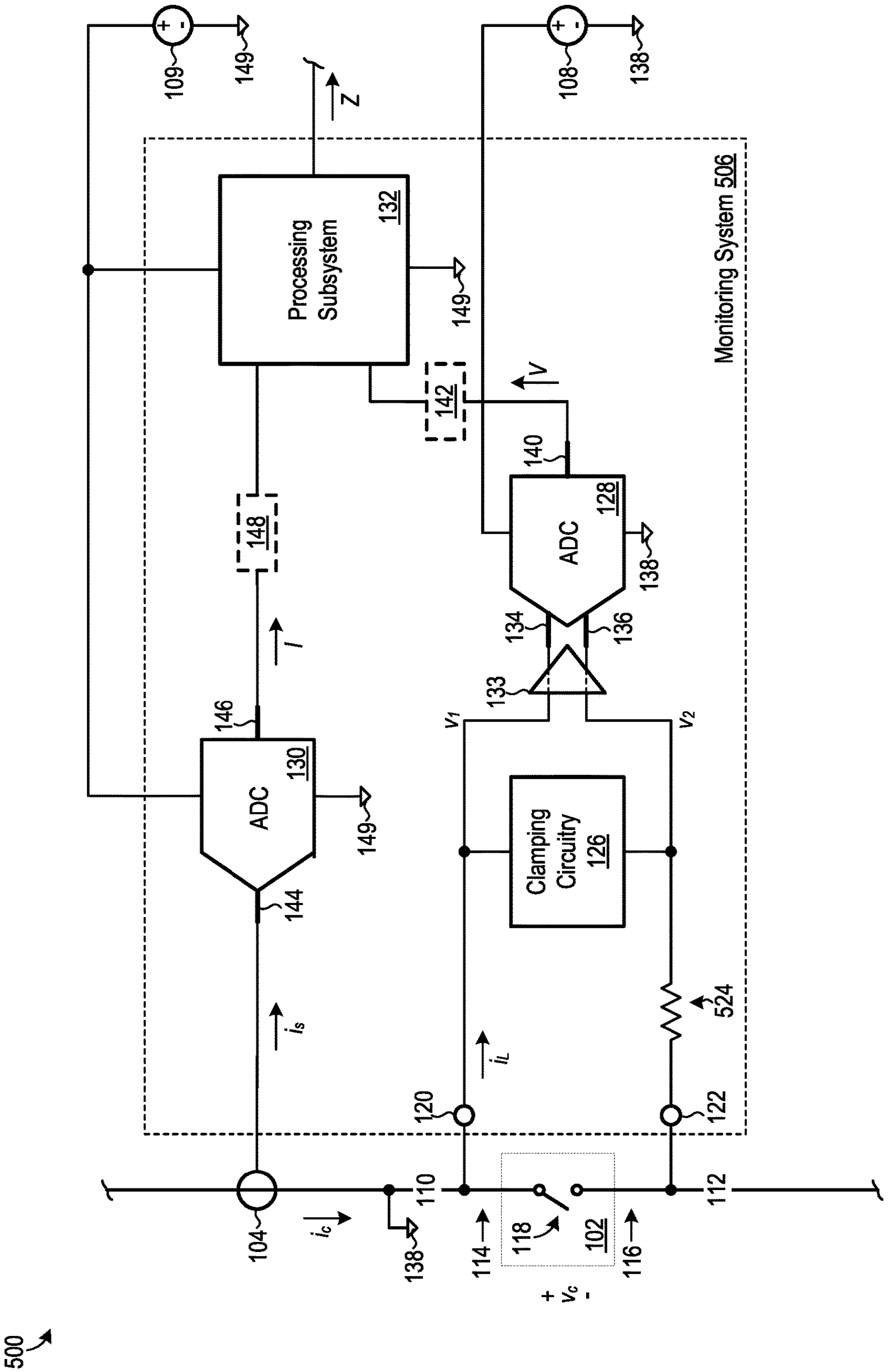
FIG. 5 is a schematic diagram of an embodiment of the FIG. 1 electrical environment where an impedance element is embodied by a resistor.
Figure 6:
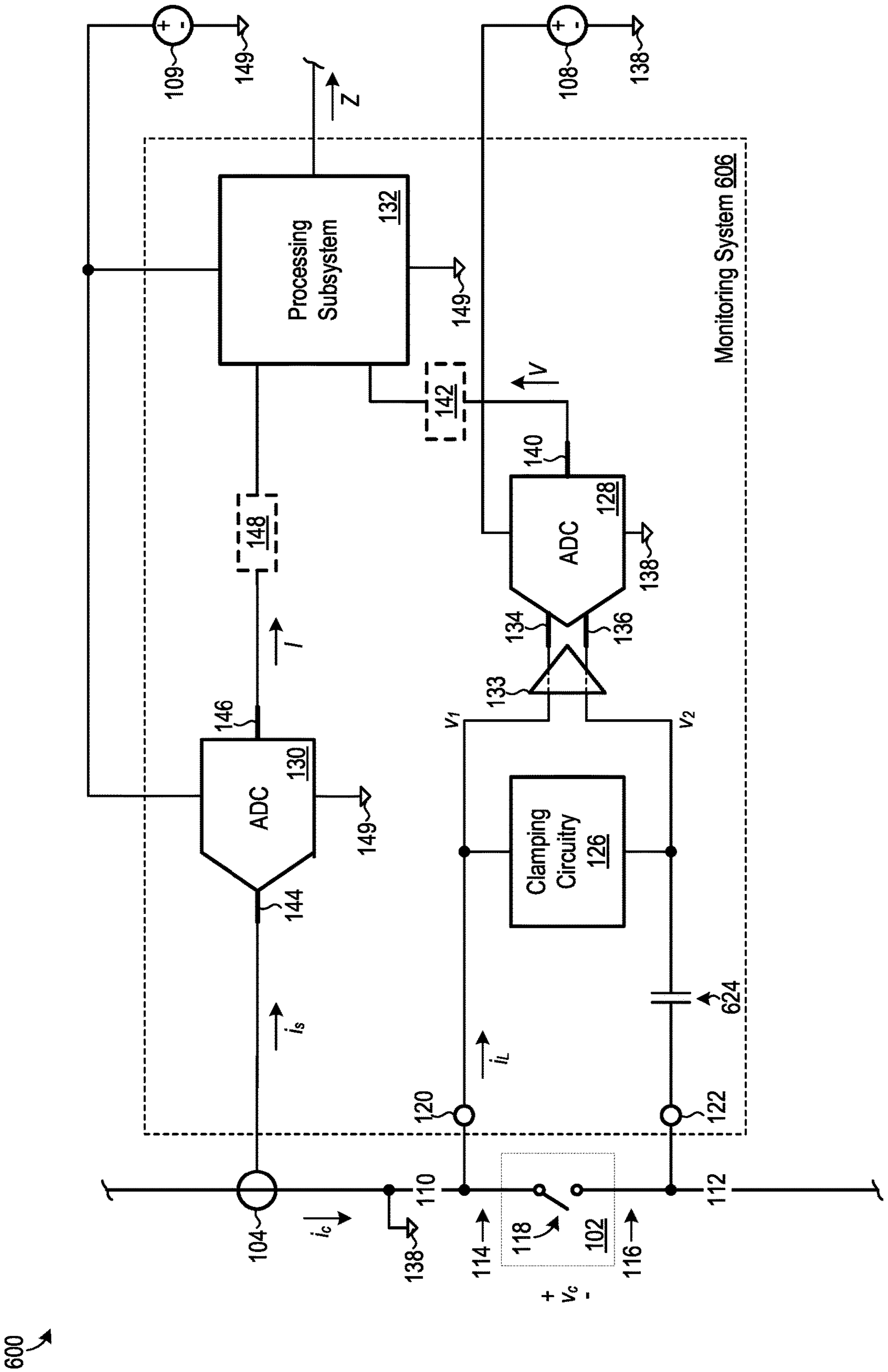
FIG. 6 is a schematic diagram of an embodiment of the FIG. 1 electrical environment where an impedance element is embodied by a capacitor.
Figure 7:
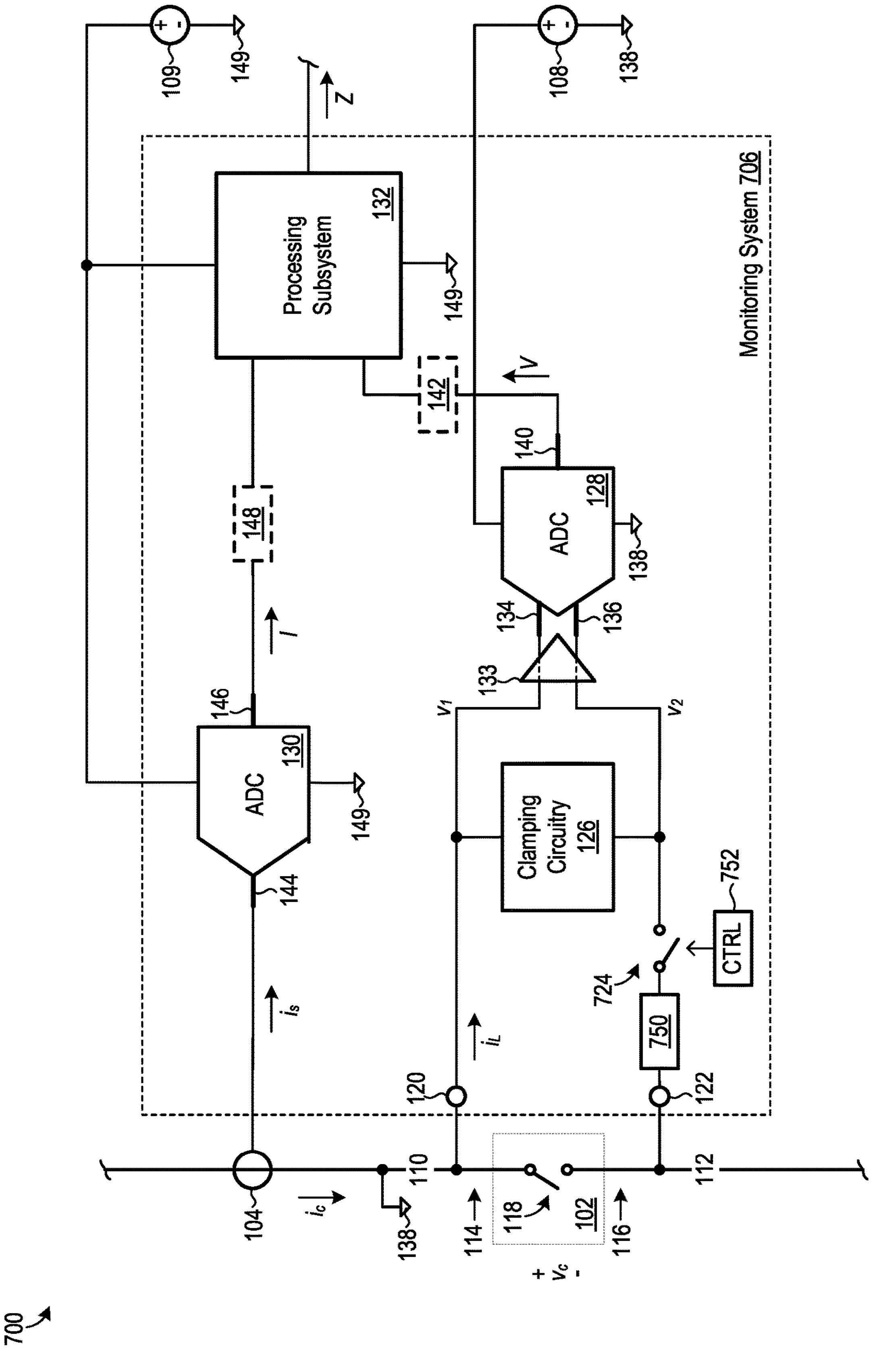
FIG. 7 is a schematic diagram of an embodiment of the FIG. 1 electrical environment where an impedance element is embodied by a combination of a switching device, an impedance device, and a controller.

Discussed below with respect to FIGS. 5-7 are several example embodiments of impedance element 124. It is understood, though, that impedance element 124 is not limited to these example embodiments. Any of the examples of FIGS. 5-7 may be implemented in any of the above-discussed embodiments of FIGS. 1-4.

FIG. 5 is a schematic diagram of an electrical environment 500, which is an embodiment of electrical environment 100 (FIG. 1) where monitoring system 106 is embodied by a monitoring system 506. Impedance element 124 is embodied by a resistor 524, or a series of smaller resistors in series to allow for any one component to fail without causing a short, in monitoring system 506. Resistor 524 is electrically coupled in series between (a) second connection port 122 and (b) each of clamping circuitry 126 and second input port 136 of ADC 128 via buffer 133. In some embodiments, resistor 524 has a resistance of at least one megaohm (MOhm) and ADC 128 has an input impedance of at least 100 KOhms. The relative impedances causes an attenuation in the measured signal, but as long as this is deterministic it can be accounted for in the calculation of the impedance, i.e., with 1 Meg and 100 k, the signal size at electrical connection device is 11 times bigger than the signal size measured across the ADC 128, and this factor may need to be accounted for in the calculation of impedance. Monitoring system 506 is capable of monitoring impedance of electrical connection device 102 in applications where current $i_c$ is direct current (DC), as well as in applications where current $i_c$ is alternating current (AC), due to resistor 524 being capable of conducting DC as well as AC.

FIG. 6 is a schematic diagram of an electrical environment 600, which is an embodiment of electrical environment 100 (FIG. 1) where monitoring system 106 is embodied by a monitoring system 606. Impedance element 124 is embodied by a capacitor 624 in monitoring system 606, where capacitor 624 is electrically coupled in series between (a) second connection port 122 and (b) each of clamping circuitry 126 and second input port 136 of ADC 128 via buffer 133. In certain embodiments, capacitor 624 has a capacitance of less than 20 nF, and ADC 128 has an input impedance of at least 800 KOhms. The impedance of ADC 128 and capacitor 624 form a high pass filter, which needs to be low enough in frequency to allow significant amount of the frequency bandwidth of the AC current signal through. For example, in embodiments where current $i_c$ has frequency of 50 Hertz (Hz), the high pass filter cutoff frequency needs to be significantly lower than 50 Hz. Any attenuation from this filter needs to be accommodated in the calculation of the impedance to be monitored, and drift in components may cause the magnitude and phase shift of the voltage measurement versus the current measurement, and this magnitude and phase shift may also need to be accommodated for in current measurement and in processing by processing subsystem 132. Buffer 133 may have an input impedance (or a separate input impedance may be provided), that is greater than 1 Megaohm, for example 10 megaohm, meaning that for the same coupling capacitor 624, the high pass filter pole is 10 times lower in frequency. Monitoring system 606 is capable of monitoring impedance of electrical connection device 102 solely in applications where current $i_c$ is AC, due to capacitor 624 being incapable of conducting DC.

FIG. 7 is a schematic diagram of an electrical environment 700, which is an embodiment of electrical environment 100 (FIG. 1) where monitoring system 106 is embodied by a monitoring system 706. Impedance element 124 is embodied by combination of a switching device 724, an impedance device 750, and a controller (CTRL) 752, in monitoring system 706. Switching device 724 and impedance device 750 are electrically coupled in series between (a) second connection port 122 and (b) each of clamping circuitry 126 and second input port 136 of ADC 128 via buffer 133. Switching device 724 includes, for example, one or more transistors (e.g., two FETs electrically coupled in series with opposing body diode orientations), an electromechanical relay, a solid-state relay, or a micro-electro-mechanical systems (MEMS) switch. Controller 752 is configured to control switching device 724 such that (a) switching device 724 is closed when electrical connection device 102 is closed and (b) switching device 724 is open when electrical connection device 102 is open. Accordingly, switching device 724 enables ADC 128 to sample voltage $v_c$ when electrical connection device 102 is closed, and switching device 724 blocks voltage $v_c$ from being applied across first input port 134 and second input port 136 when electrical connection device 102 is open. However, there may be delay between when electrical connection device 102 opens and when switching device 724 opens. Impedance device 750 protects ADC 128 from damage due to high input voltage during such delay. In some embodiments, impedance device 750 has a resistance in the KOhm range, e.g., ones, tens, or hundreds of KOhms. Impedance device 750 includes, for example, a resistor, a variable resistor, a negative temperature coefficient (NTC) thermistor, an electronic fuse, or a ferrite device.

In some embodiments, controller 752 is at least partially powered from second power node 112, such that controller 752 is active whenever electrical connection device 102 is closed. Certain embodiments of controller 752 include charge pump circuitry, optically isolated circuitry, or a digital-isolator with isolated power (not shown), such as to generate a sufficiently high voltage to control one or more transistors, or other elements, of switching device 724 with an isolated signal. A control signal outputted by controller 752 for controlling switching device 724 may be derived directly from a signal that controls switch 118, or the control signal may be indirectly derived, e.g., by detecting change in voltage on second power node 112 versus voltage on first power node 110 that occurs when electrical connection device 102 opens.

Discussed below with respect to FIGS. 8-13 are several example embodiments of clamping circuitry 126. It is understood, though, that clamping circuitry 126 is not limited to these example embodiments. Any of the examples of FIGS. 8-13 may be implemented in any of the above-discussed embodiments of FIGS. 1-7.

Figure 8:
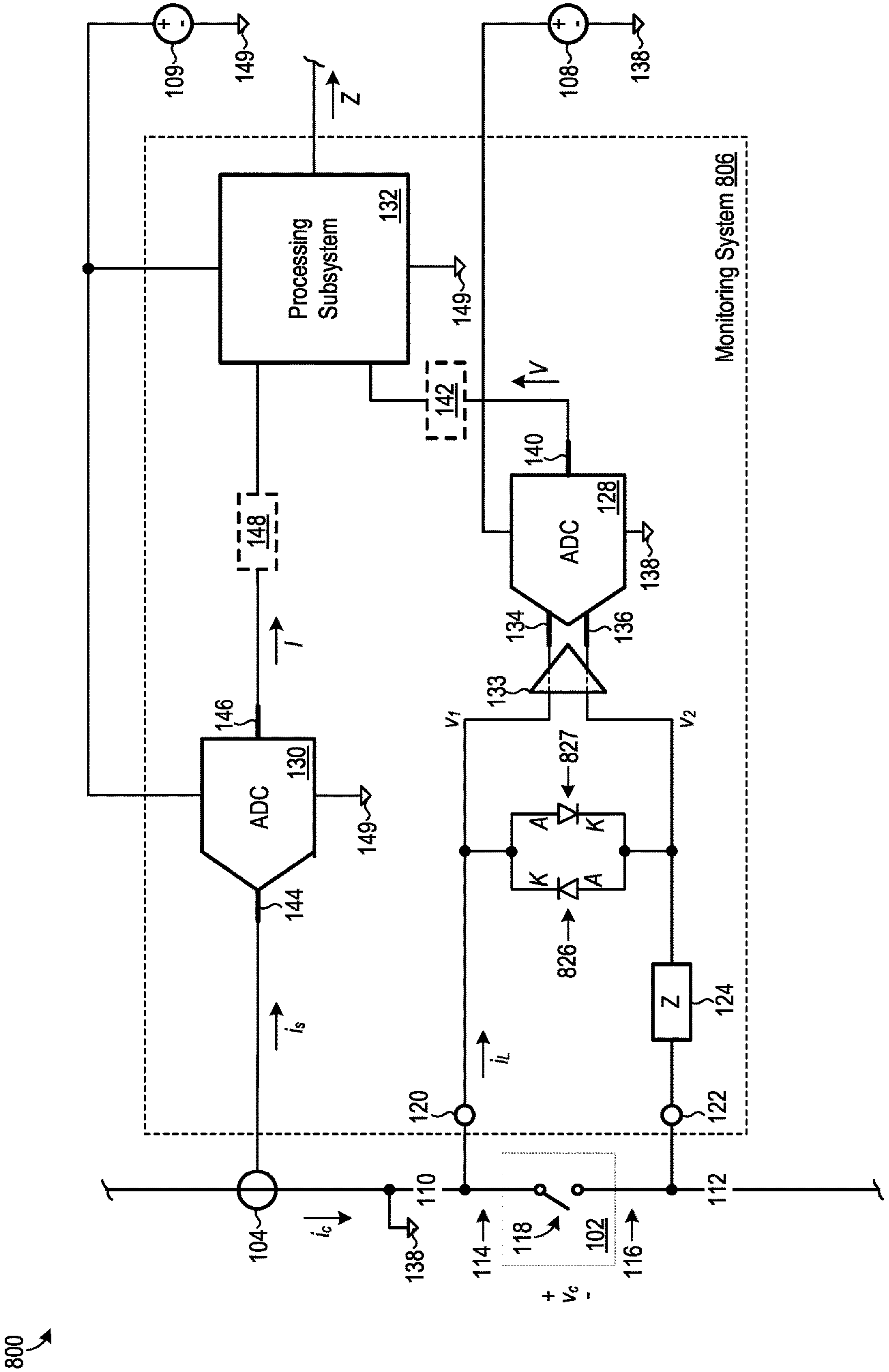
FIG. 8 is a schematic diagram of an embodiment of the FIG. 1 electrical environment where clamping circuitry is embodied by a combination of two diodes.

FIG. 8 is a schematic diagram of an electrical environment 800, which is an embodiment of electrical environment 100 (FIG. 1) where monitoring system 106 is embodied by a monitoring system 806. Clamping circuitry 126 is embodied by combination of a first diode 826 and a second diode 827 in monitoring system 806. Each of first diode 826 and second diode 827 is electrically coupled between first input port 134 of ADC 128 and second input port 136 of ADC 128 via buffer 133. However, first diode 826 and second diode 827 have opposing orientations. Specifically, a cathode (K) of first diode 826 is electrically coupled to first input port 134 of ADC 128 via buffer 133, while an anode (A) of second diode 827 is electrically coupled to first input port 134 of ADC 128 via buffer 133. Additionally, an anode of first diode 826 is electrically coupled to second input port 136 of ADC 128 via buffer 133, while a cathode of second diode 827 is electrically coupled to second input port 136 of ADC 128 via buffer 133. First diode 826 and second diode 827 clamp voltage between first input port 134 of ADC 128 and second input port 136 of ADC 128 to a diode drop voltage, e.g., approximately 0.6 volt to 0.7 volt. Consequently, voltage $v_c$ across electrical connection device 102 when electrical connection device 102 is closed must be less than a diode drop voltage, for monitoring system 806 to properly operate. It should also be noted that first diode 826 clamps voltage $v_2$ to a diode drop voltage above a voltage of reference node 138, in view of reference node 138 being the same electrical node as first power node 110.

Figure 9:
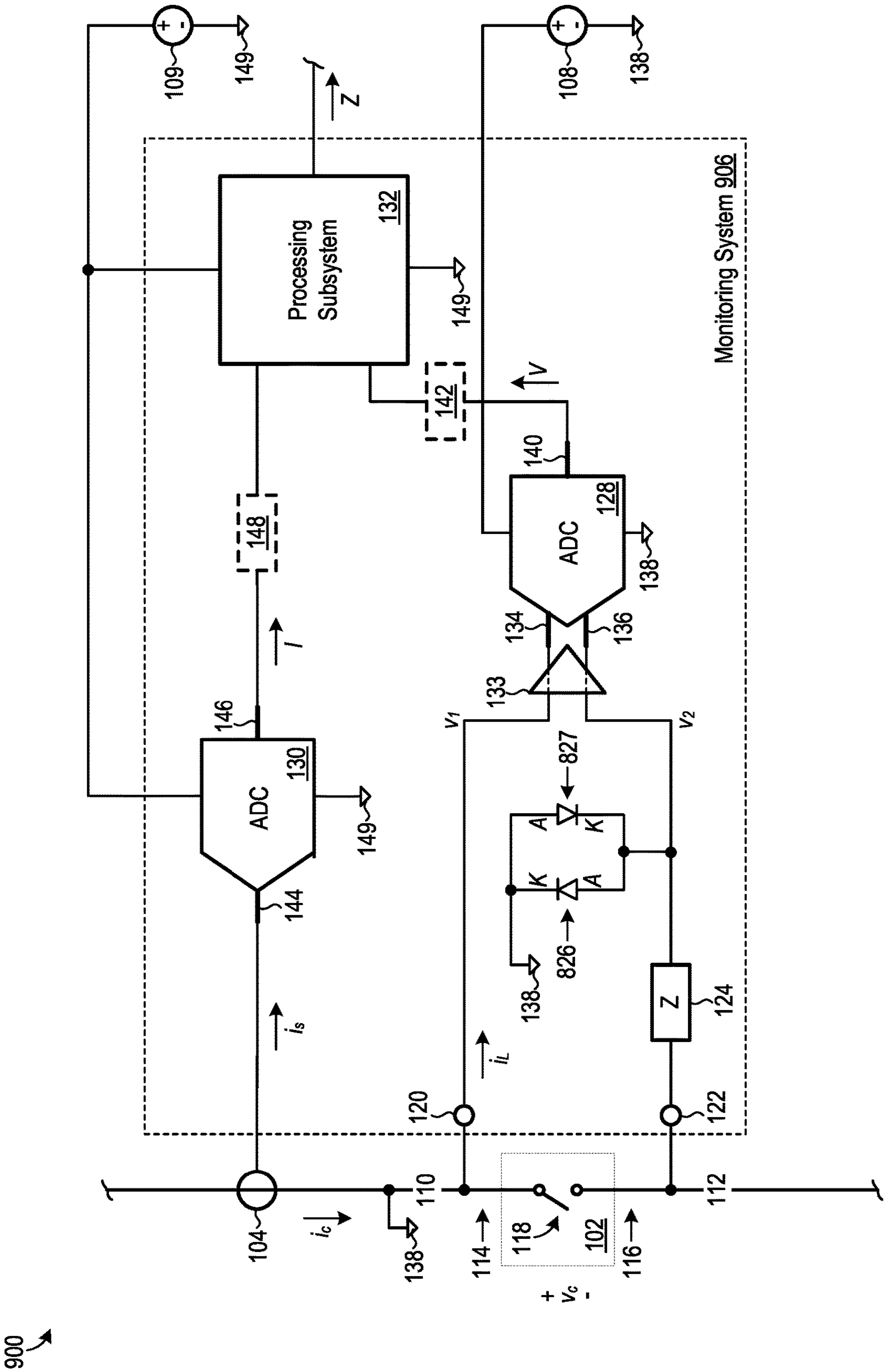
FIG. 9 is a schematic diagram of an alternate embodiment of the FIG. 8 electrical environment where two diodes are replaced with a single diode.

FIG. 9 is a schematic diagram of an electrical environment 900, which is an embodiment of electrical environment 800 (FIG. 8) where monitoring system 106 is embodied by a monitoring system 906 and where one side of each of first diode 826 and second diode 827 is electrically coupled to reference node 138, instead of to first input port 134 of ADC 128 via buffer 133. First diode 826 and second diode 827 perform in the same manner in FIG. 9 as in FIG. 8. In an alternate embodiment of electrical environment 900 where reference node 138 is the same as second power node 112, each of first diode 826 and second diode 827 is electrically coupled between reference node 138 and second input port 136 of ADC 128 via buffer 133.

Figure 10:
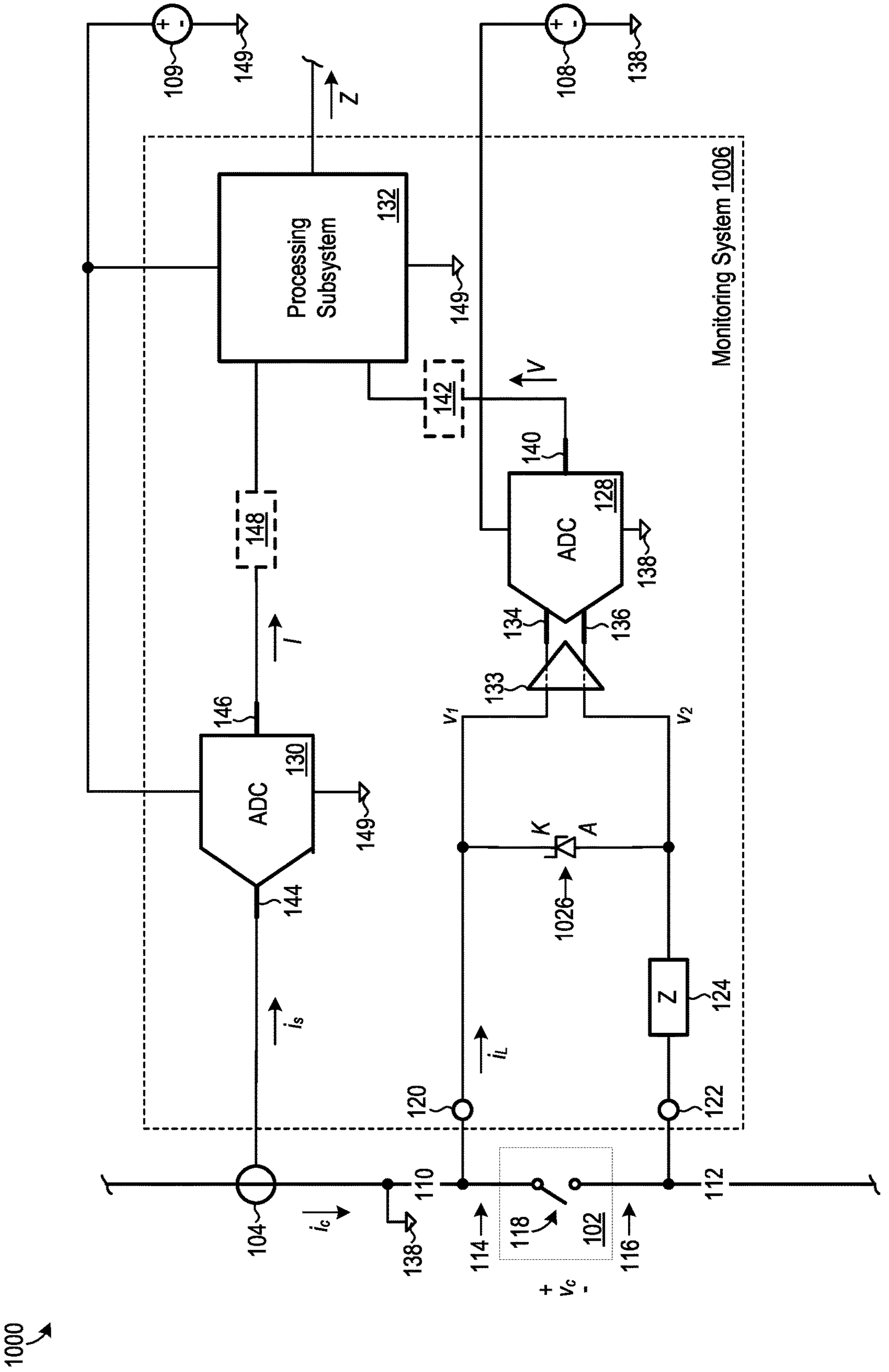
FIG. 10 is a schematic diagram of an embodiment of the FIG. 1 electrical environment where clamping circuitry is embodied by a Zener diode.

FIG. 10 is a schematic diagram of an electrical environment 1000, which is an embodiment of electrical environment 100 (FIG. 1) where monitoring system 106 is embodied by a monitoring system 1006. Clamping circuitry 126 is embodied by a Zener diode 1026 in monitoring system 1006. Zener diode 1026 is electrically coupled between first input port 134 of ADC 128 via buffer 133 and second input port 136 of ADC 128 via buffer 133. Zener diode 1026 operates similarly to the combination of first diode 826 and second diode 827 of FIG. 8, except that voltage across Zener diode 1026 will be a Zener voltage, instead of a diode drop voltage, when Zener diode 1026 is reversed biased, i.e., when its cathode is at a higher electrical potential than its anode. The orientation of Zener diode 1026 in monitoring system 1006 could be reversed. Additionally, Zener diode 1026 could alternately be electrically coupled between (a) second input port 136 of ADC 128 via buffer 133 and (b) reference node 138.

Figure 11:
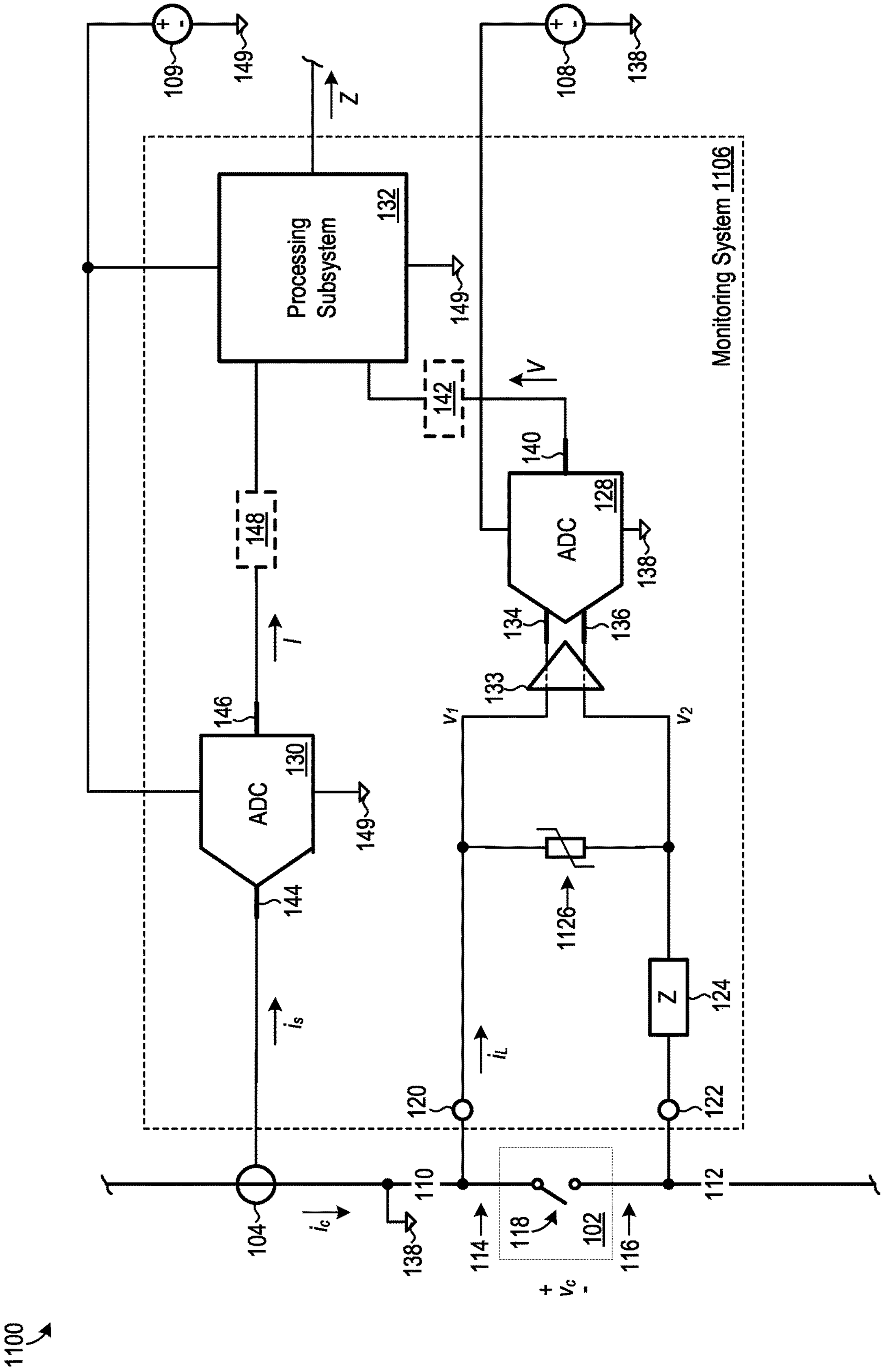
FIG. 11 is a schematic diagram of an embodiment of the FIG. 1 electrical environment where clamping circuitry is embodied by a metal oxide varistor.

FIG. 11 is a schematic diagram of an electrical environment 1100, which is an embodiment of electrical environment 100 (FIG. 1) where monitoring system 106 is embodied by a monitoring system 1106. Clamping circuitry 126 is embodied by a metal oxide varistor (MOV) 1126 in monitoring system 1106. MOV 1126 is electrically coupled between first input port 134 of ADC 128 via buffer 133 and second input port 136 of ADC 128 via buffer 133. MOV 1126 has a high resistance when voltage across MOV 1126 is low. However, resistance of MOV 1126 nonlinearly decreases with increasing voltage across MOV 1126, such that MOV 1126 clamps voltage between first input port 134 of ADC 128 and second input port 136 of ADC 128, thereby protecting ADC 128 and buffer 133 from high input voltage. MOV 1126 could alternately be electrically coupled between (a) second input port 136 of ADC 128 via buffer 133 and (b) reference node 138.

Figure 12:
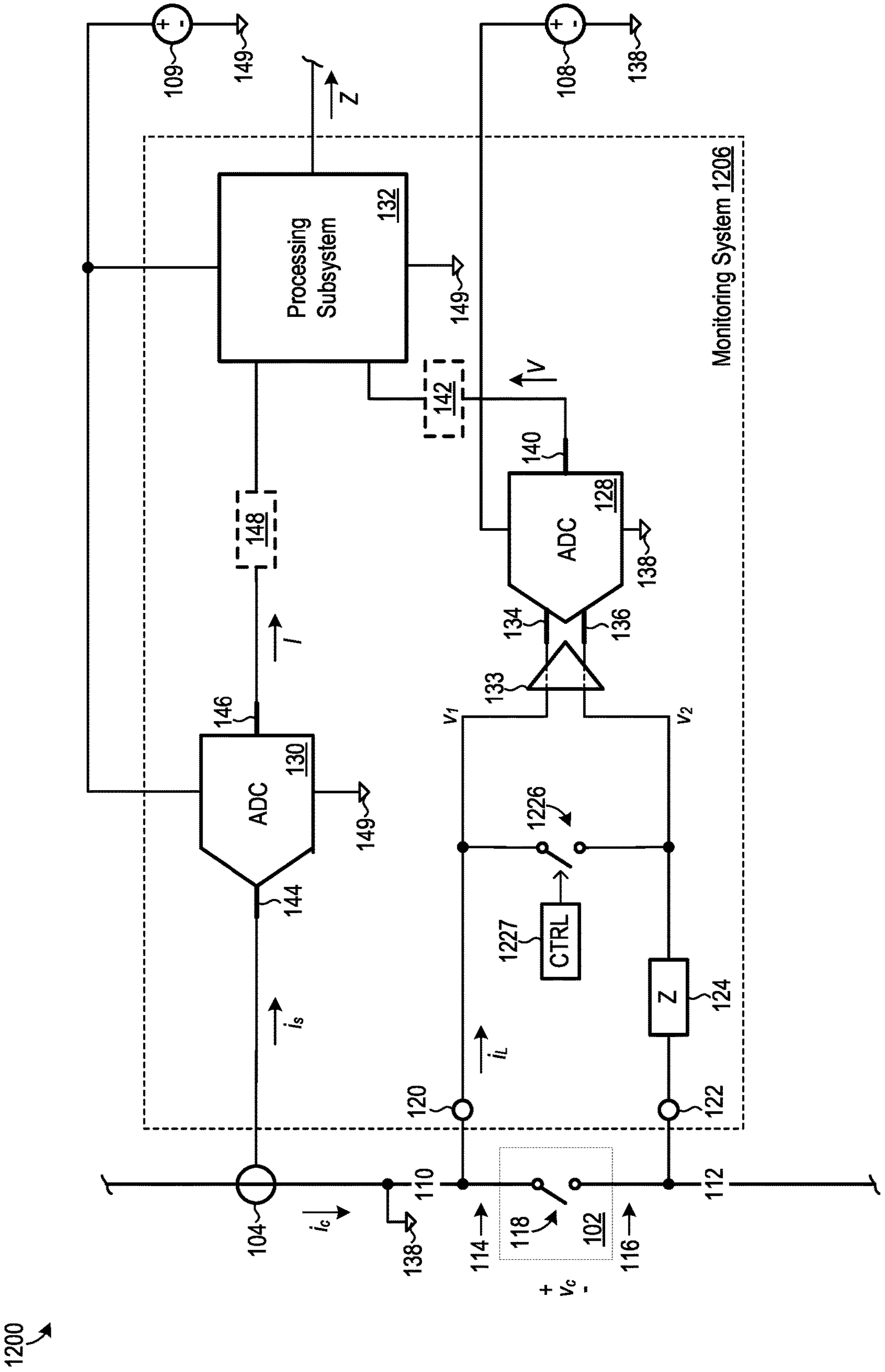
FIG. 12 is a schematic diagram of an embodiment of the FIG. 1 electrical environment where clamping circuitry is embodied by a combination of a switching device and a controller.

FIG. 12 is a schematic diagram of an electrical environment 1200, which is an embodiment of electrical environment 100 (FIG. 1) where monitoring system 106 is embodied by a monitoring system 1206. Clamping circuitry 126 is embodied by combination of a switching device 1226 and a controller 1227 in monitoring system 1206. Switching device 1226 is electrically coupled between first input port 134 of ADC 128 via buffer 133 and second input port 136 of ADC 128 via buffer 133. Switching device 1226 includes, for example, one or more transistors (e.g., two FETs electrically coupled in series with opposing body diode orientations), an electromechanical relay, a solid-state relay, or a MEMS switch. Controller 1227 is configured to control switching device 1226 such that (a) switching device 1226 is open when electrical connection device 102 is closed and (b) switching device 1226 is closed when electrical connection device 102 is open. Accordingly, switching device 1226 clamps voltage across first input port 134 of ADC 128 and second input port 136 of ADC 128 when electrical connection device 102 is open. Controller 1227 may derive a control signal for switching device 1226 directly from a signal that controls switch 118 in electrical connection device 102, or controller 1227 may indirectly derive a control signal for controlling switching device 1226, e.g., by detecting the change in the voltage on second power node 112 versus the voltage on first power node 110, that occurs when electrical connection device 102 opens. Switching device 1226 could alternately be electrically coupled between (a) second input port 136 of ADC 128 via buffer 133 and (b) reference node 138.

Figure 13:
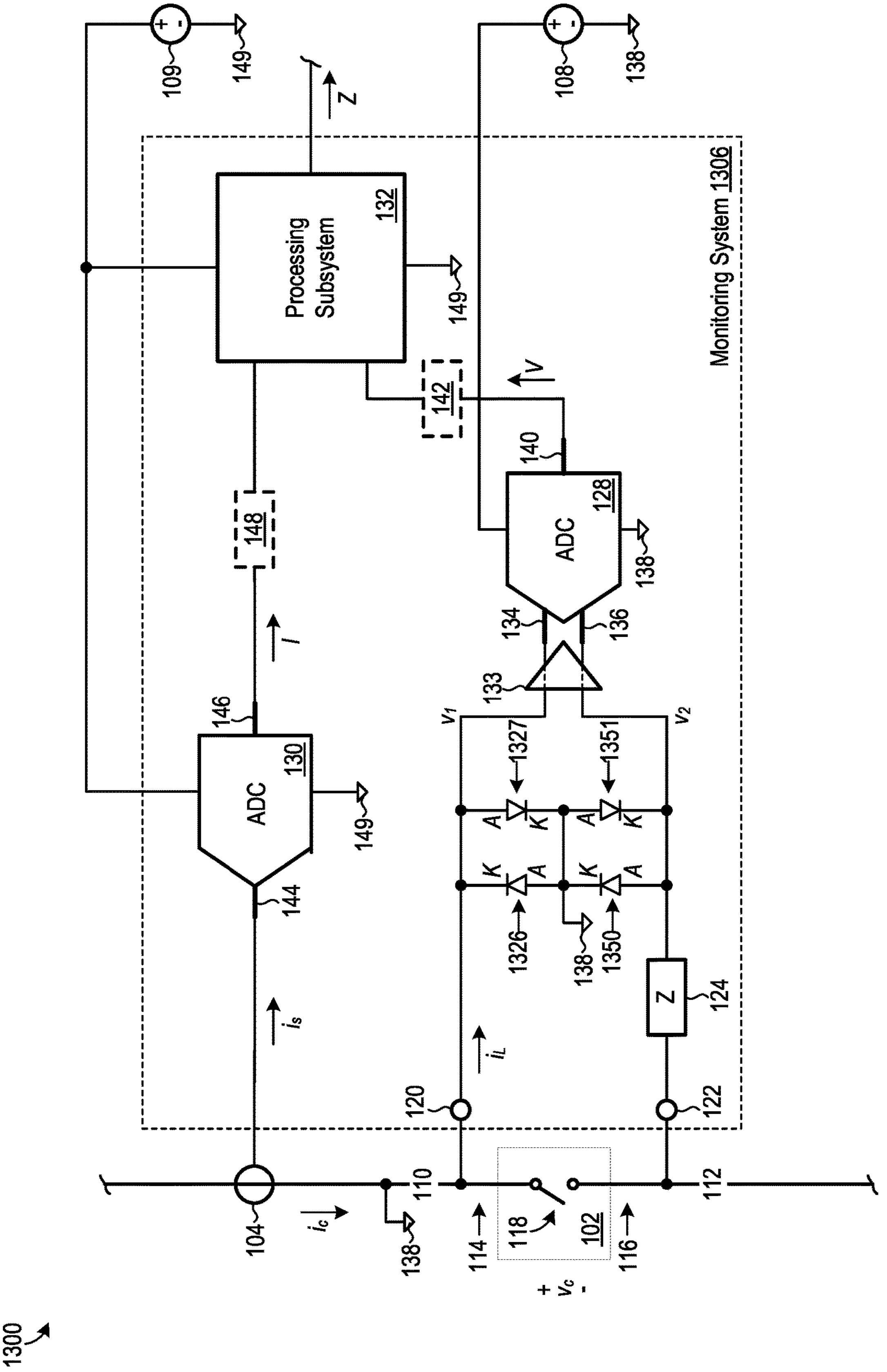
FIG. 13 is a schematic diagram of an embodiment of the FIG. 1 electrical environment where clamping circuitry is embodied by a combination of four diodes.

FIG. 13 is a schematic diagram of an electrical environment 1300, which is an embodiment of electrical environment 100 (FIG. 1) where monitoring system 106 is embodied by a monitoring system 1306. Clamping circuitry 126 is embodied by combination of a first diode 1326, a second diode 1327, a third diode 1350, and a fourth diode 1351, in monitoring system 1306. Each of first diode 1326 and second diode 1327 is electrically coupled between first input port 134 of ADC 128 via buffer 133 and reference node 138. Specifically, an anode of first diode 1326 is electrically coupled to reference node 138, and a cathode of first diode 1326 is electrically coupled to first input port 134 of ADC 128 via buffer 133. An anode of second diode 1327 is electrically coupled to first input port 134 of ADC 128 via buffer 133, and a cathode of second diode 1327 is electrically coupled to reference node 138. Each of third diode 1350 and fourth diode 1351 is electrically coupled between second input port 136 of ADC 128 via buffer 133 and reference node 138. Specifically, a cathode of third diode 1350 is electrically coupled to reference node 138, and an anode of third diode 1350 is electrically coupled to second input port 136 of ADC 128 via buffer 133. A cathode of fourth diode 1351 is electrically coupled to second input port 136 of ADC 128 via buffer 133, and an anode of fourth diode 1351 is electrically coupled to reference node 138. Third diode 1350 and fourth diode 1351 collectively clamp second input port 136 of ADC 128 to a diode drop voltage above a voltage of reference node 138.

Figure 21:
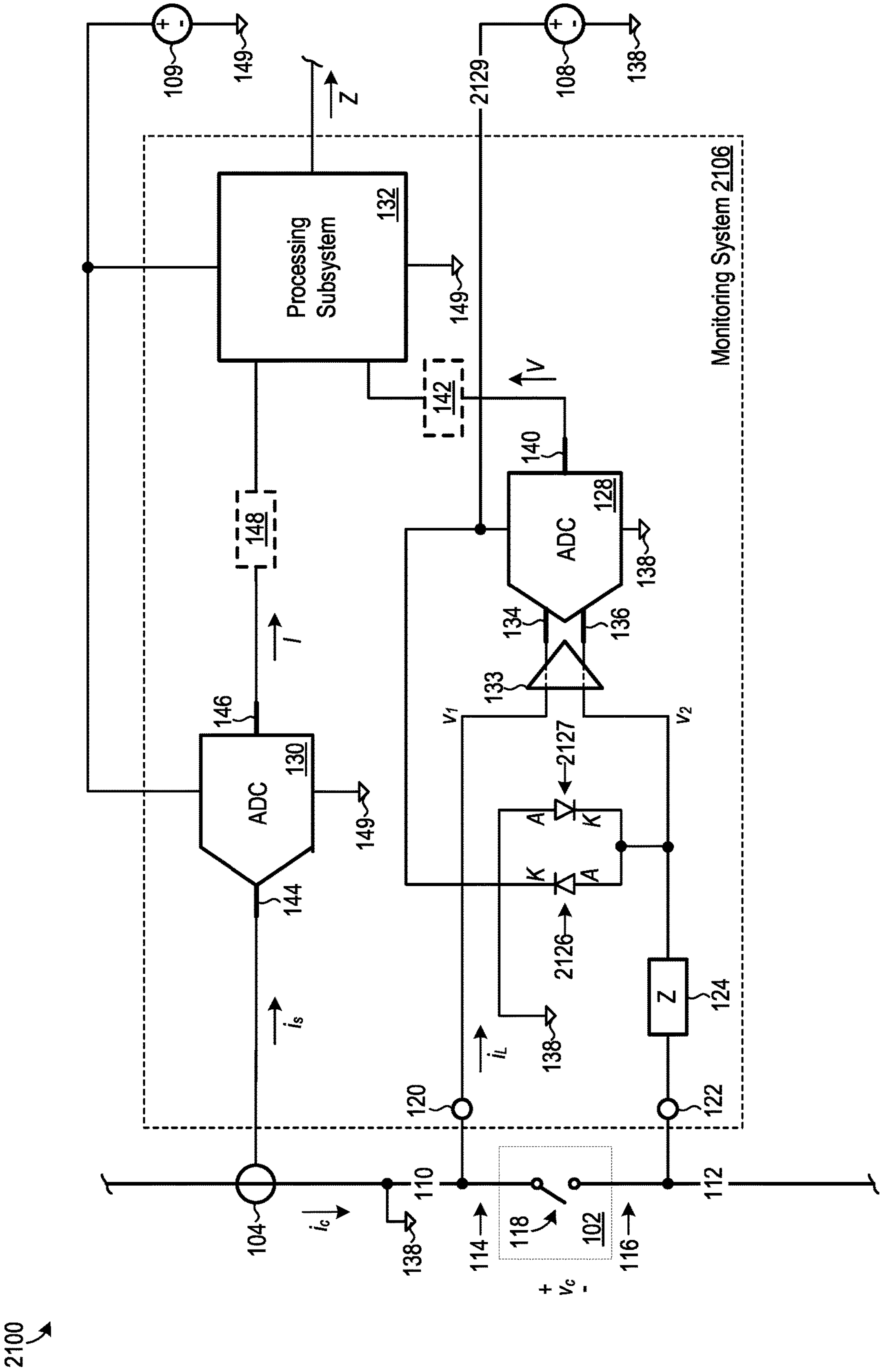
FIG. 21 is a schematic diagram of another embodiment of the FIG. 1 electrical environment where clamping circuitry is embodied by a combination of two diodes.

FIG. 21 is a schematic diagram of an electrical environment 2100, which is an embodiment of electrical environment 100 (FIG. 1) where monitoring system 106 is embodied by a monitoring system 2106. Clamping circuitry 126 is embodied by a combination of a first diode 2126 and a second diode 2127 in monitoring system 2106. An anode of first diode 2126 is electrically coupled to second input port 136 of ADC 128 via buffer 133, and a cathode of first diode 2126 is electrically coupled to power supply 108 via a power rail 2129 powered by power supply 108. A cathode of second diode 2127 is electrically coupled to second input port 136 of ADC 128 via buffer 133, and an anode of second diode 2127 is electrically coupled to reference node 138.

Figure 14:
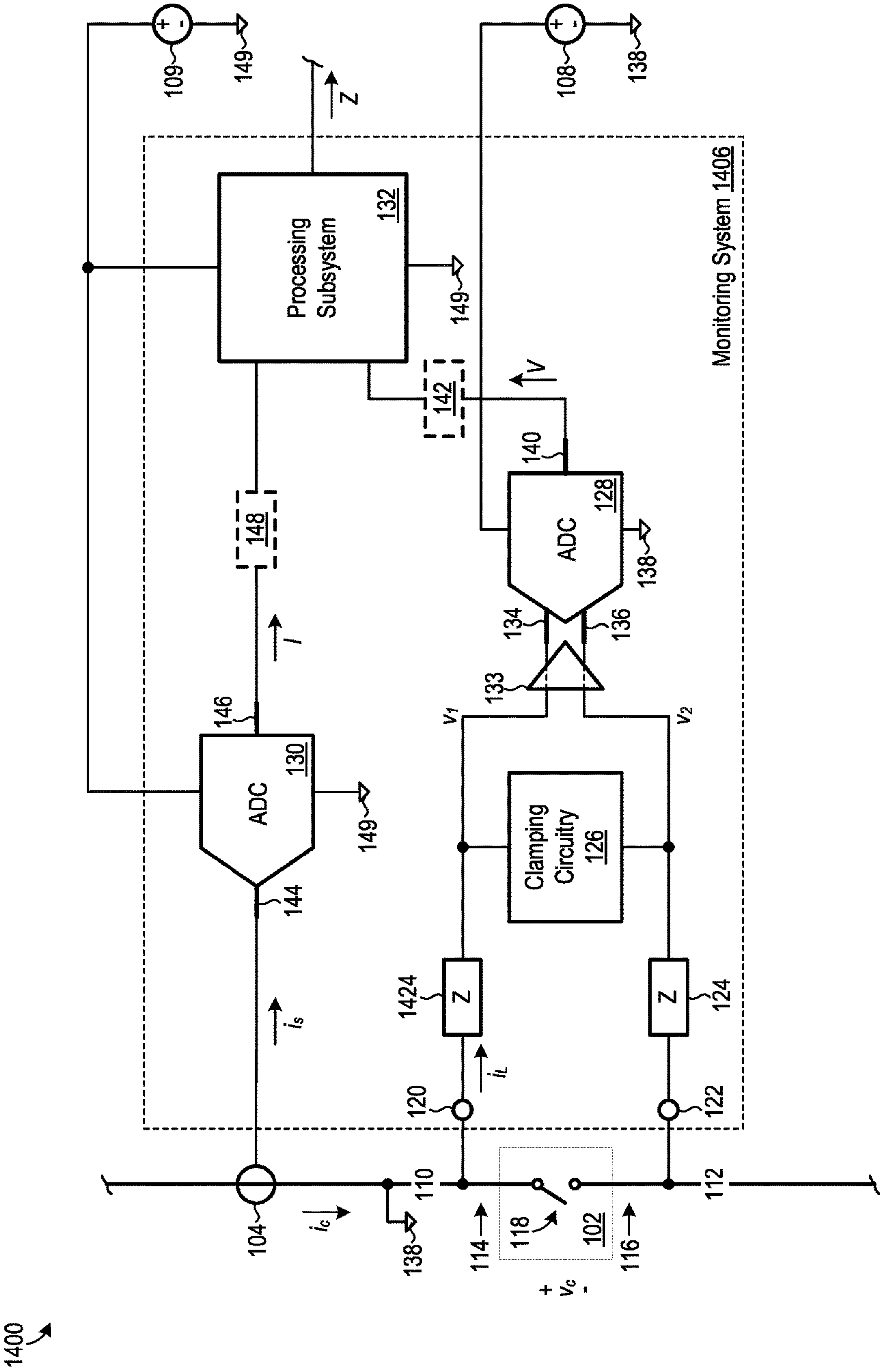
FIG. 14 is a schematic diagram of an alternate embodiment of the FIG. 1 electrical environment including two impedance elements.

Additionally, monitoring system 106 could be configured to include a plurality of impedance elements for limiting magnitude of leakage current $i_L$ and protecting ADC 128 and buffer 133. For example, FIG. 14 is a schematic diagram of an electrical environment 1400, which is an alternate embodiment of electrical environment 100 (FIG. 1) where monitoring system 106 is replaced with a monitoring system 1406. Monitoring system 1406 is like monitoring system 106 except that monitoring system 106 further includes a second impedance element 1424, which is electrically coupled in series with first connection port 120. Accordingly, first input port 134 of ADC 128 and second input port 136 of ADC 128 are electrically coupled to first connection port 120 and second connection port 122 via second impedance element 1424 and impedance element 124, respectively. In certain embodiments, each of impedance element 124 and second impedance element 1424 have at least substantially identical impedance values, such that ADC 128 input ports 134 and 136 are electrically coupled to symmetrical impedance elements. In certain embodiments, second impedance element 1424 includes a resistor similar that of the impedance element of FIG. 5, a capacitor similar to that of the impedance element of FIG. 6, or a combination of a switching device, an impedance device, and a controller similar to that of the impedance element of FIG. 7. Incorporation of two impedance elements 124 and 1424 in monitoring system 1406 may be advantageous in that there will still be a limitation on leakage current $i_L$ magnitude, as well as some protection for ADC 128 and buffer 133, should one of the two impedance elements fail. Additionally, one or both of impedance element 124 and second impedance element 1424 could be replaced with two or more impedance elements electrically coupled in series, to achieve further redundancy in case of an impedance element failure. Furthermore, it may be advantageous for clamping circuitry 126 to be symmetrical with respect to each of first input port 134 of ADC 128 and second input port 136 of ADC 128 in embodiments where impedance element 124 and second impedance element 1424 have common impedance values, to realize first order symmetry of input circuitry to ADC 128. Examples of symmetrical embodiments of clamping circuitry 126 include, but are not limited to, the embodiments of FIGS. 8, 11, 12, and 13.

Figure 15:
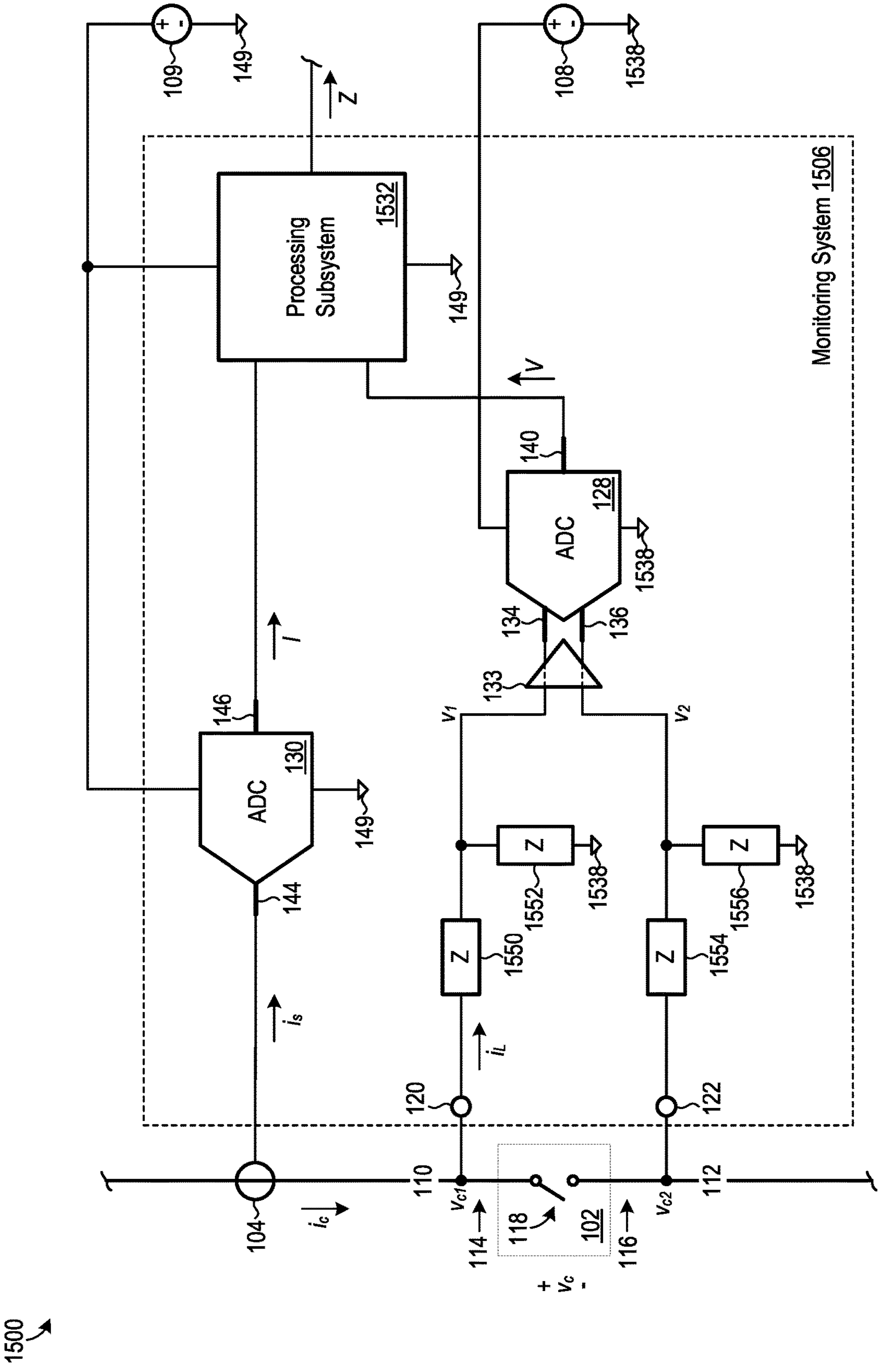
FIG. 15 is a schematic diagram of an alternate embodiment of the FIG. 1 electrical environment including impedance elements configured to divide-down voltage at inputs of an analog-to-digital converter.

FIG. 15 is a schematic diagram of an electrical environment 1500, which is an alternate embodiment of electrical environment 100 (FIG. 1) where monitoring system 106 is replaced with a monitoring system 1506, and monitoring system 1506 is another embodiment of the new systems for monitoring impedance of an electrical connection device disclosed herein. Monitoring system 1506 differs from monitoring system 106 in that (a) impedance element 124 and clamping circuitry 126 are replaced with a first impedance element 1550, a second impedance element 1552, a third impedance element 1554, and a fourth impedance element 1556, (b) processing subsystem 132 is replaced with a processing subsystem 1532, and (c) ADC 128 need not be referenced to first power node 110 or second power node 112. FIG. 15 does not show optional isolation device 142 and 148, but it is understood that one or both of these isolation devices could be included in monitoring system 1506.

First impedance element 1550 is electrically coupled between first connection port 120 and first input port 134 of ADC 128 via buffer 133, and second impedance element 1552 is electrically coupled between first input port 134 of ADC 128 via buffer 133 and a reference node 1538. Third impedance element 1554 is electrically coupled between second connection port 122 and second input port 136 of ADC 128 via buffer 133, and fourth impedance element 1556 is electrically coupled between second input port 136 of ADC 128 via buffer 133 and reference node 1538. Each of ADC 128 and power supply 108 is also referenced to reference node 1538. In contrast to reference node 138 of electrical environment 100, reference node 1538 need not be the same as first power node 110 or second power node 112. Instead, reference node 1538 could be essentially any electrical node, e.g., a floating electrical node, earth ground, or a chassis ground. Additionally, in some embodiments, reference node 1538 is the same electrical node as reference node 149 of power supply 109, ADC 130, and processing subsystem 1532, such that ADC 128, ADC 130, and processing subsystem 1532 are referenced to a common reference node.

In applications where current $i_c$ is AC, impedance elements 1550, 1552, 1554, and 1556 may each include one or more respective resistors, or impedance elements 1550, 1552, 1554, and 1556 may each include one or more respective capacitors. In applications where current $i_c$ is DC, impedance elements 1550, 1552, 1554, and 1556 include one or more respective resistors. First impedance element 1550 and third impedance element 1554 are selected to help minimize flow of leakage current $i_L$, such as to prevent material flow of leakage current $i_L$ when electrical connection device 102 is open, as well as to help protect ADC 128 and buffer 133. In certain embodiments, first impedance element 1550 and third impedance element 1554 are configured to collectively have a sufficiently large impedance such that magnitude of leakage current $i_L$ does not exceed 0.5 mA when voltage $v_c$ across electrical connection device is at 110% of its maximum rated value when electrical connection device 102 is open. Additionally, first impedance element 1550 and second impedance element 1552 are collectively configured to divide down magnitude of a voltage $v_{c1}$ at first power node 110, measured with respect to reference node 1538, to a voltage $v_1$ at first input port 134 of ADC 128 having a sufficiently low value to prevent damage to ADC 128 (and buffer 133). Similarly, third impedance element 1554 and fourth impedance element 1556 are collectively configured to divide down magnitude of a voltage $v_{c2}$ at second power node 112, measured with respect to reference node 1538, to a voltage $v_2$ at second input port 136 of ADC 128 having a sufficiently low value to prevent damage to ADC 128 (and buffer 133).

For example, in certain embodiments, first impedance element 1550, second impedance element 1552, third impedance element 1554, and fourth impedance element 1556 are each a resistor having respective resistances $R_1$, $R_2$, $R_3$, and $R_4$. Voltage $v_1$ is related to voltage $v_{c1}$ according to EQN. 1 below, assuming negligible flow of current into first input port 134 of ADC 128, where $D_1$ is a divider ratio defined by EQN. 2 below. Similarly, voltage $v_2$ is related to voltage $v_{c2}$ according to EQN. 3 below, assuming negligible flow of current into second input port 136 of ADC 128, where $D_2$ is a divider ratio defined by EQN. 4 below.

$$v_1 = D_1 v_{c1} \quad \text{(EQN. 1)}$$

$$D_1 = \frac{R_2}{R_1 + R_2} \quad \text{(EQN. 2)}$$

$$v_2 = D_2 v_{c2} \quad \text{(EQN. 3)}$$

$$D_2 = \frac{R_4}{R_3 + R_4} \quad \text{(EQN. 4)}$$

Processing subsystem 1532 is similar to processing subsystem 132 of electrical environment 100. However, certain embodiments of processing subsystem 1532 are further configured to generate digital signal Z representing impedance of electrical connection device 102 based on values of current $i_c$ and voltage $v_c$ sampled a plurality of times, to compensate for mismatch in divider ratios $D_1$ and $D_2$. In particular, values of divider ratios $D_1$ and $D_2$ are ideally identical, and a difference in respective values of the two divider ratios leads to an error in digital signal V. It may difficult, though, to achieve identical values of the two divider ratios due to manufacturing variations, or other variations, among impedance elements 1550, 1552, 1554, and 1556. Applicant has determined that error in digital signal V due to mismatch in divider ratios $D_1$ and $D_2$ can be canceled out by determining impedance of electrical connection device 102 based on values of current $i_c$ and voltage $v_c$ sampled a plurality of times.

For example, assume that I(1) and I(2) are values of digital signal I generated by ADC 130 at respective times $t_1$ and $t_2$, such that digital signals I(1) and I(2) represent magnitude of current $i_c$ at times $t_1$ and $t_2$, respectively, and magnitude of current $i_c$ at time $t_2$ is substantially different than magnitude of current $i_c$ at time $t_1$. Additionally, assume that V(1) and V(2) are values of digital signal V generated by ADC 128 at respective times $t_1$ and $t_2$, such that digital signals V(1) and V(2) represent magnitude of voltage $v_c$ at times $t_1$ and $t_2$, respectively. Particular embodiments of processing subsystem 1532 are configured to generate digital signal Z according to EQN. 5 below, or a variation thereof, which cancels out effects of mismatch between divider ratios $D_1$ and $D_2$. It should be noted that EQN. 5 assumes that voltage $v_{c1}$ at first power node 110 is stable. Therefore, in applications where current $i_c$ is AC, each value of V(1) and V(2) should be based on a complete cycle of current $i_c$. For example, each value of V(1) and V(2) may be a root mean squared (RMS) value determined over a complete cycle of current $i_c$.

$$Z = \frac{V(1) - V(2)}{[I(1) - I(2)]D_1} \quad \text{(EQN. 5)}$$

Figure 16:
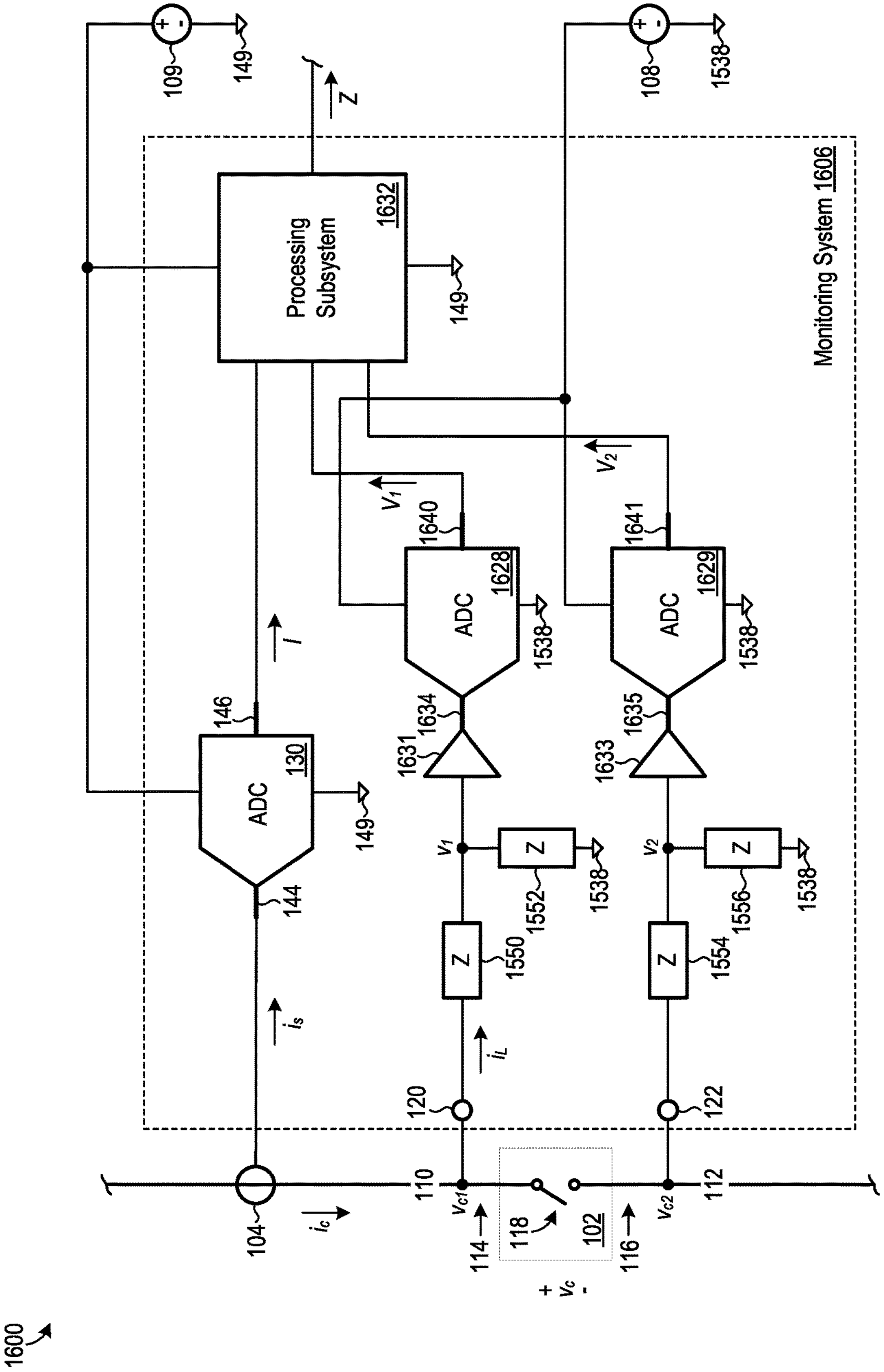
FIG. 16 is a schematic diagram of an alternate embodiment of the FIG. 15 electrical environment including a monitoring system with three analog-to-digital converters.

FIG. 16 is a schematic diagram of an electrical environment 1600, which is an alternate embodiment of electrical environment 1500 (FIG. 15) where monitoring system 1506 is replaced with a monitoring system 1606. Monitoring system 1606 differs from monitoring system 1506 in that (a) single ADC 128 and buffer 133 are replaced with two ADCs 1628 and 1629 with respective buffers 1631 and 1633, and (b) processing subsystem 1532 is replaced with a processing subsystem 1632. Each of ADCs 1628 and 1629 is powered by power supply 108, and each of ADCs 1628 and 1629 is referenced to reference node 1538. ADC 1628 includes an input port 1634 and an output port 1640. Input port 1634 is electrically coupled to first connection port 120 via buffer 1631 and first impedance element 1550, and output port 1640 is communicatively coupled to processing subsystem 1632. ADC 1628 is configured to sample voltage $v_1$ at input port 1634 and generate a corresponding digital signal $V_1$ representing voltage $v_{c1}$ at first power node 110. ADC 1629 includes an input port 1635 and an output port 1641. Input port 1635 is electrically coupled to second connection port 122 via buffer 1633 and third impedance element 1554, and output port 1641 is communicatively coupled to processing subsystem 1632. ADC 1629 is configured to sample voltage $v_2$ at input port 1635 and generate a corresponding digital signal $V_2$ representing voltage $v_{c2}$ at second power node 112. One or both of buffers 1631 and 1633 could be omitted without departing from the scope hereof. Additionally, buffers 1631 and 1633 could be integrated in ADCs 1628 and 1629, respectively.

Processing subsystem 1632 is similar to processing subsystem 1532 (FIG. 15) except that processing subsystem 1632 is configured to generated digital signal Z based on at least two digital signals representing voltage, i.e. $V_1$ and $V_2$, as well as based on digital signal I representing current, generated at two different times. For example, assume that I(1) and I(2) are values of digital signal I generated by ADC 130 at respective times $t_1$ and $t_2$, such that digital signals I(1) and I(2) represent magnitude of current $i_c$ at times $t_1$ and $t_2$, respectively, and magnitude of current $i_c$ at time $t_2$ significantly differs from magnitude of current $i_c$ at time $t_1$. Additionally, assume that $V_1$(1) and $V_1$(2) are values of digital signal $V_1$ generated by ADC 1628 at respective times $t_1$ and $t_2$, such that digital signals $V_1$(1) and $V_1$(2) represent magnitude of voltage $v_{c1}$ at times $t_1$ and $t_2$, respectively. Furthermore, assume that $V_2$(1) and $V_2$(2) are values of digital signal $V_2$ generated by ADC 1629 at respective times $t_1$ and $t_2$, such that digital signals $V_2$(1) and $V_2$(2) represent magnitude of voltage $v_{c2}$ at times $t_1$ and $t_2$, respectively. Particular embodiments of processing subsystem 1632 are configured to generate digital signal Z according to EQN. 6 below, or a variation thereof, which cancels out effects of mismatch between divider ratios $D_1$ and $D_2$. Additionally, EQN. 6 does not require that sampled voltage be stable to accurately determine digital signal Z. As such, each value of $V_1$(1), $V_1$(2), $V_2$(1), and $V_2$(2) is optionally a single respective sampled value, instead of an RMS value based on a complete cycle of current $i_c$, although processing subsystem 1632 will properly operate with each value of V1(1), V1(2), V2(1), and V2(2) being an RMS value.

$$Z = \frac{D_1\left(I(1) - I(2)\cdot\frac{V_1(1)}{V_1(2)}\right)}{V_2(1) - V_2(2)\cdot\frac{V_1(1)}{V_1(2)}} \quad \text{(EQN. 6)}$$

Figure 17:
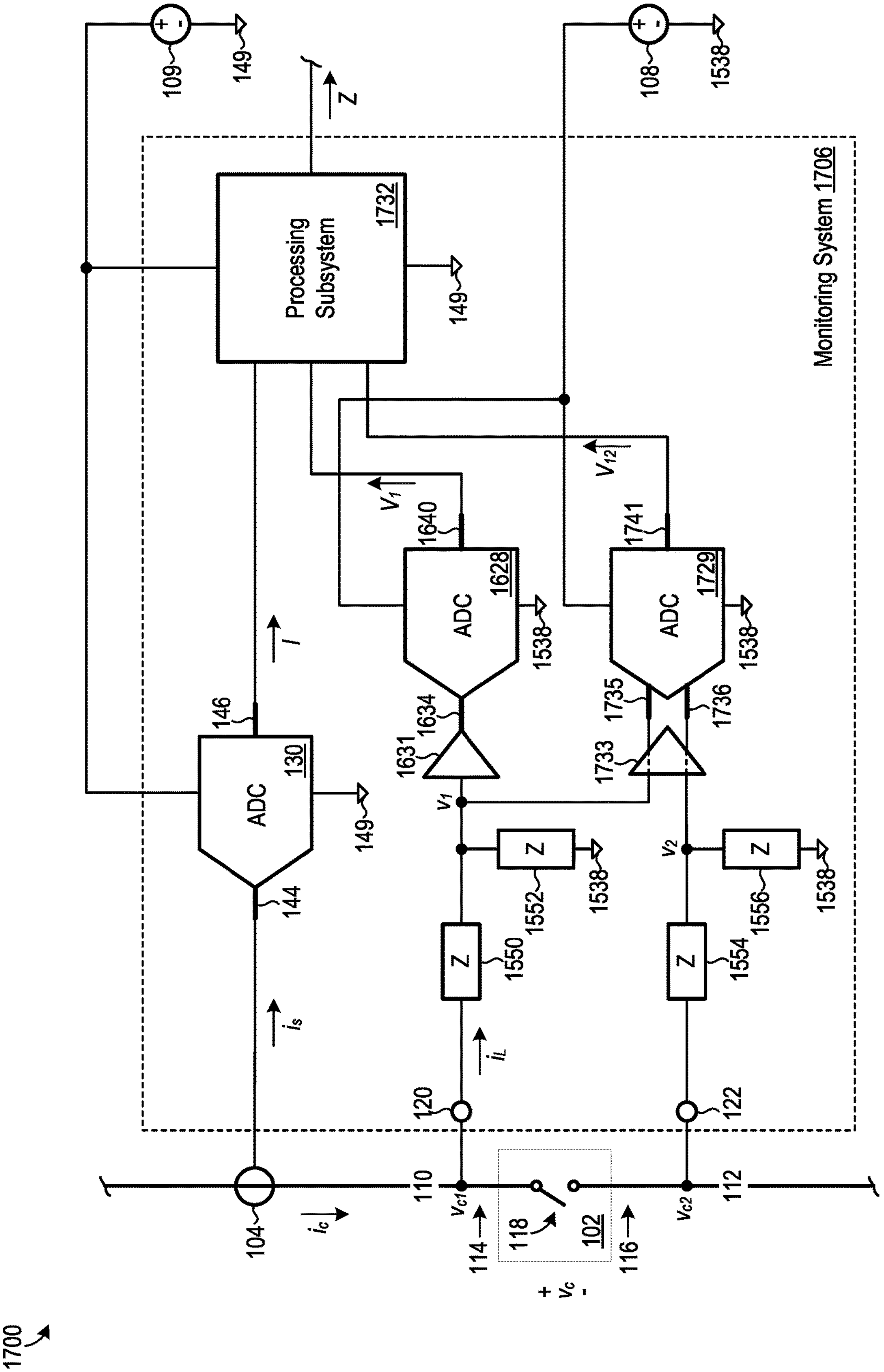
FIG. 17 is a schematic diagram of an alternate embodiment of the FIG. 16 electrical environment including a monitoring system with a different analog-to-digital converter topology than the FIG. 16 monitoring system.

FIG. 17 is a schematic diagram of an electrical environment 1700, which is an alternate embodiment of electrical environment 1600 (FIG. 16) where monitoring system 1606 is replaced with a monitoring system 1706. Monitoring system 1706 differs from monitoring system 1606 in that (a) ADC 1629 is replaced with an ADC 1729, (b) buffer 1633 is replaced with a buffer 1733, and (c) processing subsystem 1632 is replaced with a processing subsystem 1732. The ADC topology of monitoring system 1706 may achieve a higher gain than the ADC topology of monitoring system 1606. ADC 1729 is powered by power supply 108, and ADC 1729 is referenced to reference node 1538. ADC 1729 includes a first input port 1735, a second input port 1736, and an output port 1741. First input port 1735 is electrically coupled to first connection port 120 via buffer 1733 and first impedance element 1550, and second input port 1736 is electrically coupled to second connection port 122 via buffer 1733 and third impedance element 1554. ADC 1729 is configured to sample voltage $v_1$ at first input port 1735 and voltage $v_2$ at second input port 1736 to generate a digital signal $V_{12}$ representing a difference between voltage $v_1$ and voltage $v_2$, where voltage $V_{12}$ represents voltage $v_c$. Digital signal $V_{12}$ is communicatively coupled to processing subsystem 1732. Processing subsystem 1732 is similar to processing subsystem 1632 of FIG. 16, and processing subsystem 1732 is configured to generate digital signal Z representing impedance of electrical connection device 102 using respective values of digital signal I, digital signal $V_1$, and digital signal $V_{12}$, generated at two different times. Some embodiments of processing subsystem 1732 are configured to generate digital signal Z using a variation of EQN. 6 above. Buffer 1631 and/or buffer 1733 could be omitted without departing from the scope hereof. Additionally, buffer 1631 and buffer 1733 could be integrated in ADCs 1628 and 1729, respectively.

Signal Processing

Impedance is fundamentally equal to voltage over current. Consequently, calculated impedance may be erroneous when using small values of current, due to noise in a current signal being of comparable magnitude to the current signal. Consequently, certain embodiments of processing subsystems 132, 1532, 1632, 1732, 1832 (discussed below), and 1932 (discussed below) are configured to minimize impedance calculation errors resulting from measurements being made when current $i_c$ has a small magnitude, or in the case of processing subsystems 1632 and 1732 which calculate impedance based on a difference between two current values, when a difference between two measured values of current $i_c$ has a small magnitude. For example, some embodiments of processing subsystems 132, 1532, 1632, 1732, 1832, and 1932 are configured to calculate expected noise in digital signal I, or expected noise in a difference between two values of digital signal I, and inhibit determination of digital signal Z in response to magnitude of current $i_c$, or a magnitude of a difference in two values of current $i_c$, being smaller than a magnitude of the expected noise with a predetermined threshold value added. As another example, certain embodiments of processing subsystems 132, 1532, 1632, 1732, 1832, and 1932 are configured to determine an average value of digital signal Z from multiple calculated values of digital signal Z, where calculated values of digital signal Z corresponding to larger magnitude of current $i_c$, or larger magnitude in difference of values of current $i_c$, are weighted more heavily than calculated values of digital signal Z corresponding to smaller magnitude of current $i_c$, or smaller magnitude in difference of values of current $i_c$, Furthermore, some embodiments of processing subsystems 132, 1532, 1632, 1732, 1832, and 1932 are configured to monitor calculated values of digital signal Z and assess qualities of the calculated digital signals based on statistical properties of the calculated digital signals, such as standard deviation or weighted standard deviation. For example, certain embodiments of processing subsystems 132, 1532, 1632, 1732, 1832, and 1932 are configured to determine that calculated values of digital signal Z are of acceptable quality in response to a standard deviated of calculated values of digital signal Z, or a weighted standard deviation of calculated values of digital signal Z, being above a threshold value.

Particular embodiments of processing subsystems 132, 1532, 1632, 1732, 1832, and 1932 are configured to filter received digital signals representing voltage, e.g., digital signals V, $V_1$, $V_2$, and/or $V_{12}$, to remove noise from the signals before using the digital signals to calculate impedance. For example, some embodiments of processing subsystems 132, 1532, 1632, 1732, 1832, and 1932 are configured to create a narrowband filter with a passband frequency corresponding to a frequency of current $i_c$, or a passband frequency corresponding to an expected fundamental frequency of current $i_c$ or voltage $v_c$, and use the narrowband filter to filter digital signals representing voltage before using the digital signals to calculate impedance.

There may be phase shift between digital signals representing current and digital signals representing voltage in the monitoring systems discussed above due to poles resulting from resistance and capacitance on inputs to ADCs generating digital signals representing voltage. Such phase shift may result in erroneous calculated values of impedance unless the phase shift is accounted for. Accordingly, certain embodiments of processing subsystems 132, 1532, 1632, 1732, 1832, and 1932 are configured to determine and account for phase shift between digital signals representing current and digital signals representing voltage, when calculating digital signal Z. Additionally, some embodiments of processing subsystems 132, 1532, 1632, 1732, 1832, and 1932 are configured to use RMS values of current magnitude measurements and voltage magnitude measurements calculated over a complete cycle of current $i_c$, to negate impact of phase shift on calculated values of digital signal Z.

Certain embodiments of processing subsystems 132, 1532, 1632, 1732, 1832, and 1932 are configured to estimate impedance of electrical connection device 102 based on change in voltage $v_c$ across electrical connection device 102, referred to as delta $v_c$, with differing levels of current $i_c$. As there may be random noise in measurements of delta $v_c$ and current $i_c$, delta $v_c$ and current $i_c$ may need to be measured over many samples, to leverage typical short term stability of a relationship between measured current $i_c$ and measured delta $v_c$ (although the relationship may change over longer time periods). As such, certain embodiments of processing subsystem 132, 1532, 1632, 1732, 1832, and 1932 may look at sub-periods of time to create snapshots of the relationship between measured $i_c$ and measured delta $v_c$, and then further filter these snapshots to adapt to changes, or use any changes in current $i_c$ that may occur. For example, processing subsystem 132, 1532, 1632, 1732, 1832, or 1932 could process measured values on a sample by sample basis, on a line-cycle by line cycle basis, or on a period of time by period of time basis, e.g., using an Fast Fourier Transform (FFT) process, or other signal decomposition process, over, for example, one or more seconds. One advantage in an AC current system of using a sample by sample basis where the samples are within a line period is that magnitude of current $i_c$ is likely to vary among samples when a load is present. Additionally, if no load is present, there should be no significant variation in magnitude of current $i_c$ samples, which can also be exploited by processing subsystem 132, 1532, 1632, 1732, 1832, and 1932.

One approach to extracting necessary information from measured samples of current $i_c$ and delta $v_c$ which may not be locked to a line frequency, or may vary because of changes in load, is to obtain the measured samples and curve, line, or plane fit their relationship, using processing subsystem 132, 1532, 1632, 1732, 1832, or 1932. A gradient of the fitted line can be used to extract the impedance. Curve fitting can be replaced by mathematical equivalent estimators and can use only part of the measured samples, or be weighted to more reliable samples of the measured samples. This type of approach can also be applied to the approaches described in FIGS. 15-17 which use dividers to measure either side of electrical connection device 102. Particular embodiments of these methods need for each of current $i_c$ and voltage $v_{c1}$ to be changing to factor in an estimate in error from mismatch of dividers, e.g., mismatch in divider ratios $D_1$ and $D_2$ (discussed above). Estimated error can be plotted using a three dimensional (3D) plane fit between the measure of delta $v_c$, current $i_c$, and voltage $v_{c1}$, and extracting the gradient of a plane between voltage $v_c$ and current $i_c$. Error from divider mismatch can also be estimated using a mathematical equivalent estimator. In cases, a processing subsystem (e.g., 132, 1532, 1632, 1732, 1832, or 1932) may need to manipulate the signal processing path of the samples to synchronise and equalise the response between different voltage and current measurements, and the processing subsystem may need to account for factors like offset, linearity and coupling.

Additional Embodiments

Impedance of electrical connection device 102 may be affected by temperature of electrical connection device 102. For example, impedance of electrical connection device 102 may increase with temperature. Therefore, certain embodiments of the monitoring systems discussed above are configured to monitor temperature of electrical connection device 102. Additionally, certain embodiments of processing subsystems 132, 1532, 1632, 1732, 1832, and 1932 are configured to determine a correlation between calculated impedance of electrical connection device 102 and temperature of electrical connection device 102. Temperature of electrical connection device 102 may be high, for example, due to high magnitude of current $i_c$, a loose electrical connection in the vicinity of electrical connection device 102, and/or high ambient temperature at a location of electrical connection device 102. Furthermore, particular embodiments of processing subsystems 132, 1532, 1632, 1732, 1832, and 1932 are configured to monitor status of electrical connection device 102, e.g., whether it is open or closed, such as to help determine number of occurrences of electrical connection device 102 opening while current $i_c$ has a large magnitude, as well as while current $i_c$ does not have a large magnitude.

Some embodiments of processing subsystems 132, 1532, 1632, 1732, 1832, and 1932 include a data store (not shown), such as a memory, to store calculated values of digital signal Z, such as for use in determining a trend in impedance of electrical connection device 102. Additionally, certain embodiments of processing subsystems 132, 1532, 1632, 1732, 1832, and 1932 limit or prevent storage of short term history of calculated values of digital signal Z, such as to help maintain adequate data storage space for storing long terms trends in calculated values of digital signal Z.

Certain embodiments of processing subsystems 132, 1532, 1632, 1732, 1832, and 1932 are configured to send calculated values of digital signal Z to an external data analysis system, such as for determining trends in calculated values of impedance, e.g., on a machine-by-machine basis, and/or for automatically dispatching an engineer or technician in response to calculated values of impedance crossing a threshold value. In some embodiments, the external data analysis system is implemented in a distributed computing environment, such as a cloud computing environment.

The electrical environments of FIGS. 1-17 show only a single electrical connection device for illustrative clarity. However, some applications will include multiple electrical connection devices. For example, a 3-phase delta AC electrical topology may include three electrical connection devices, a 3-phase wye AC electrical topology may include four electrical connection devices, and a DC electrical topology may include two electrical connection devices. Respective instances of the above-discussed monitoring systems may be used to individually monitor impedance of each electrical connection device in applications including multiple electrical connection devices. The plurality of instances of the monitoring systems could be configured to share one or more elements, such as a common processing subsystem, to promote cost effectiveness, simplicity, and/or small size.

Figure 18:
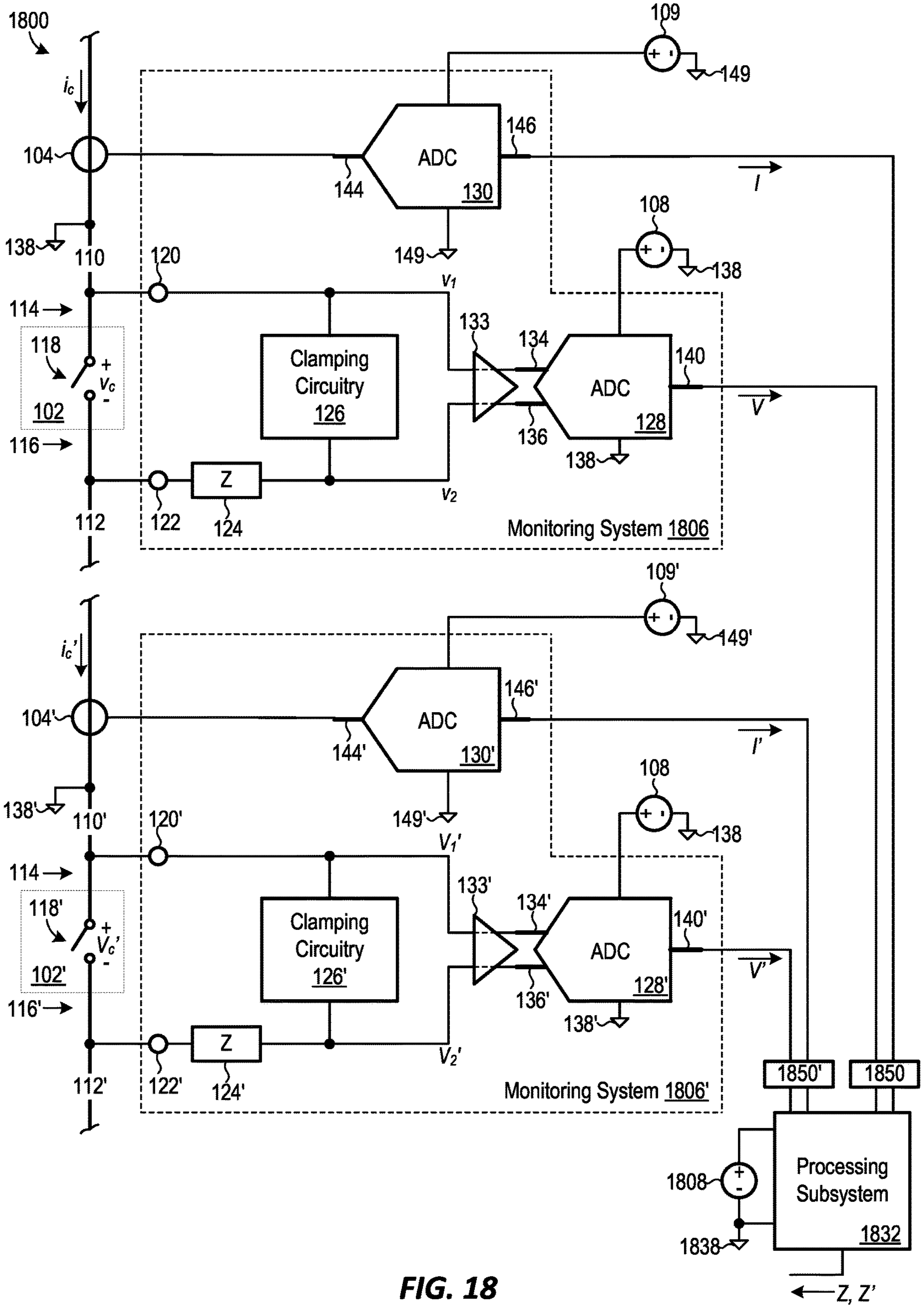
FIG. 18 is a schematic diagram of an electrical environment including two monitoring systems, according to an embodiment.

For example, FIG. 18 is a schematic diagram of an electrical environment 1800 including two monitoring systems 1806 and 1806'. The prime (') symbol in FIG. 18 designates a second instance of an associated element. For example, monitoring system 1806' is a second instance of monitoring system 1806, and as another example, current sensor 104' is a second instance of current sensor 104. Each of monitoring systems 1806 and 1806' is an alternate embodiment of monitoring system 106 (FIG. 1) with processing subsystem 132 omitted. Monitoring systems 1806 and 1806' share a common processing subsystem 1832, which is powered by a power supply 1808 and referenced to a reference node 1838. Each of monitoring system 1806, monitoring system 1806', and processing subsystem 1832 has a different power supply and difference reference nodes. Therefore, digital signals V and I are isolated by an isolation device 1850, and digital signals I' and V' are isolated by an isolation device 1850' to enable monitoring systems 1806 and 1806' to share common processing subsystem 1832. Processing subsystem 1832 is configured to generate digital signals Z and Z', respectively representing impedance of electrical connection device 102 and electrical connection device 102', based on digital signals V, I, V', and I'. For example, particular embodiments of processing subsystem 1832 are configured to (a) calculate Z by dividing V by I and (c) calculate Z' by dividing V' by I'.

Additional Functions

Signals generated by any of the monitoring systems disclosed herein may be used for one or more additional purposes in addition to determining impedance of an electrical connection device. For example, in certain embodiments, digital voltage signals V and digital current signals I are used to determine power delivered to load, such as a load electrically coupled in series with electrical connection device 102. As another example, in some embodiments, analog current signal $i_s$ or digital current signal I are monitored to determine whether electrical connection device 102 should be opened, such as in response to magnitude of analog current signal $i_s$ or digital current signal I exceeding a threshold value. Furthermore, certain embodiments of processing subsystems 132, 1532, 1632, 1732, and 1832 are configured to control operation of electrical connection device 102, such as to control whether electrical connection device 102 is open or closed.

Figure 19:
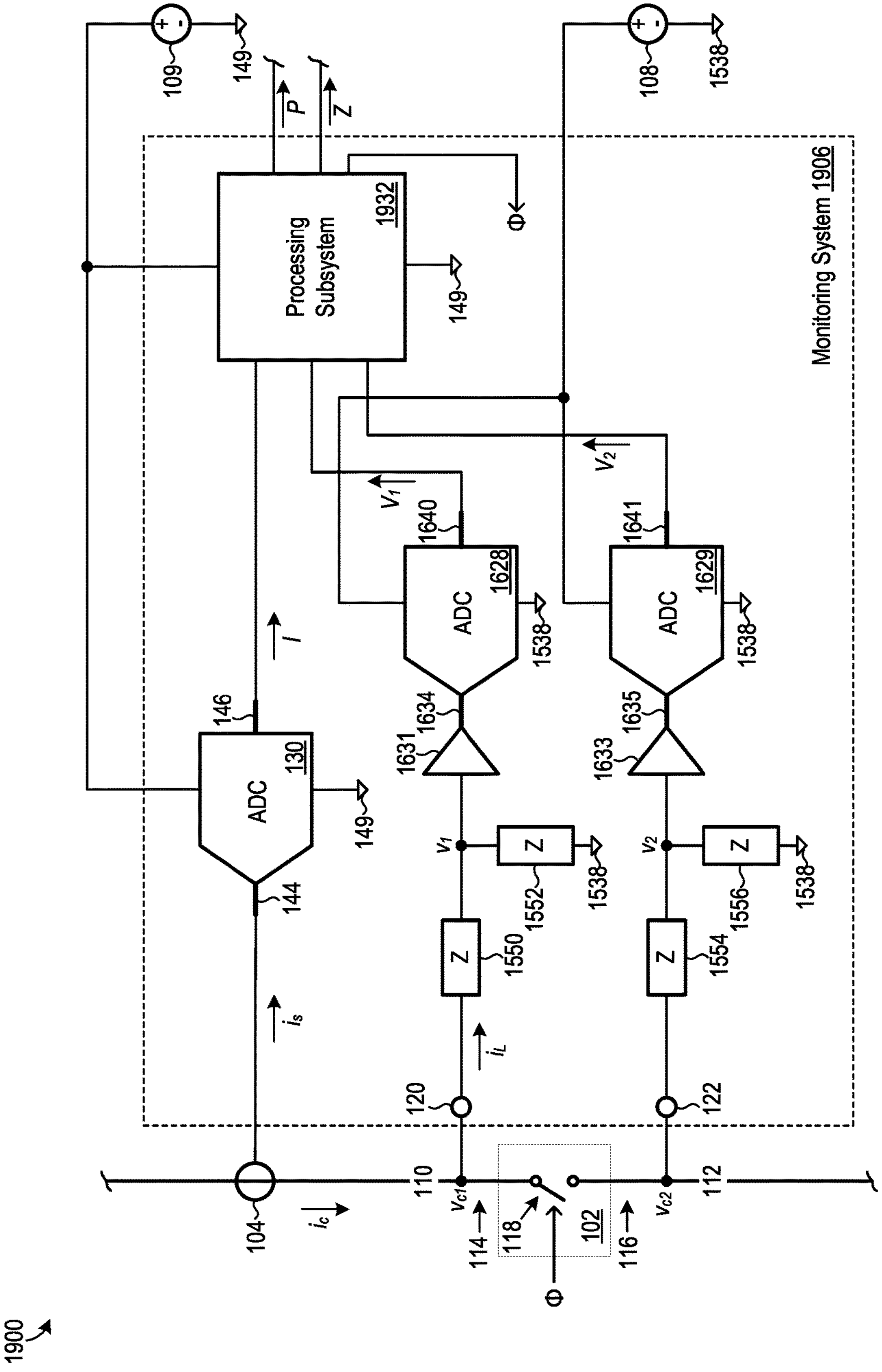
FIG. 19 is a block diagram of an electrical environment including an alternate embodiment of the FIG. 16 monitoring system that is capable of calculating power as well as controlling operating state of an electrical connection device.

For example, FIG. 19 is a schematic diagram of an electrical environment 1900 including a monitoring system 1906, which is an alternate embodiment of monitoring system 1606 (FIG. 16) including a processing subsystem 1932 in place of processing subsystem 1632. Processing subsystem 1932 is similar to processing subsystem 1632 except that (a) processing subsystem 1932 is further configured to generate a digital signal P representing power supplied to a load (not shown) electrically coupled to second power node 112 and (b) generate a control signal q for controlling a state of electrical connection device 102, i.e., whether electrical connection device 102 is open or closed. Processing subsystem 1932 is configured to generate digital signal Φ, for example, from a product of digital signal I and either digital signal $V_1$ or digital signal $V_2$. Certain embodiments of processing subsystem 1932 are configured to generate control signal Φ at least partially as a function of magnitude of digital current signal I. For example, some embodiments of processing subsystem 1932 are configured to generate control signal Φ to cause electrical connection device 102 to open in response to magnitude of digital current signal I crossing, e.g., reaching, a threshold value, such as in response to occurrence of an overcurrent condition in electrical environment 1900 or in response to a short circuit condition in electrical environment 1900.

Figure 20:
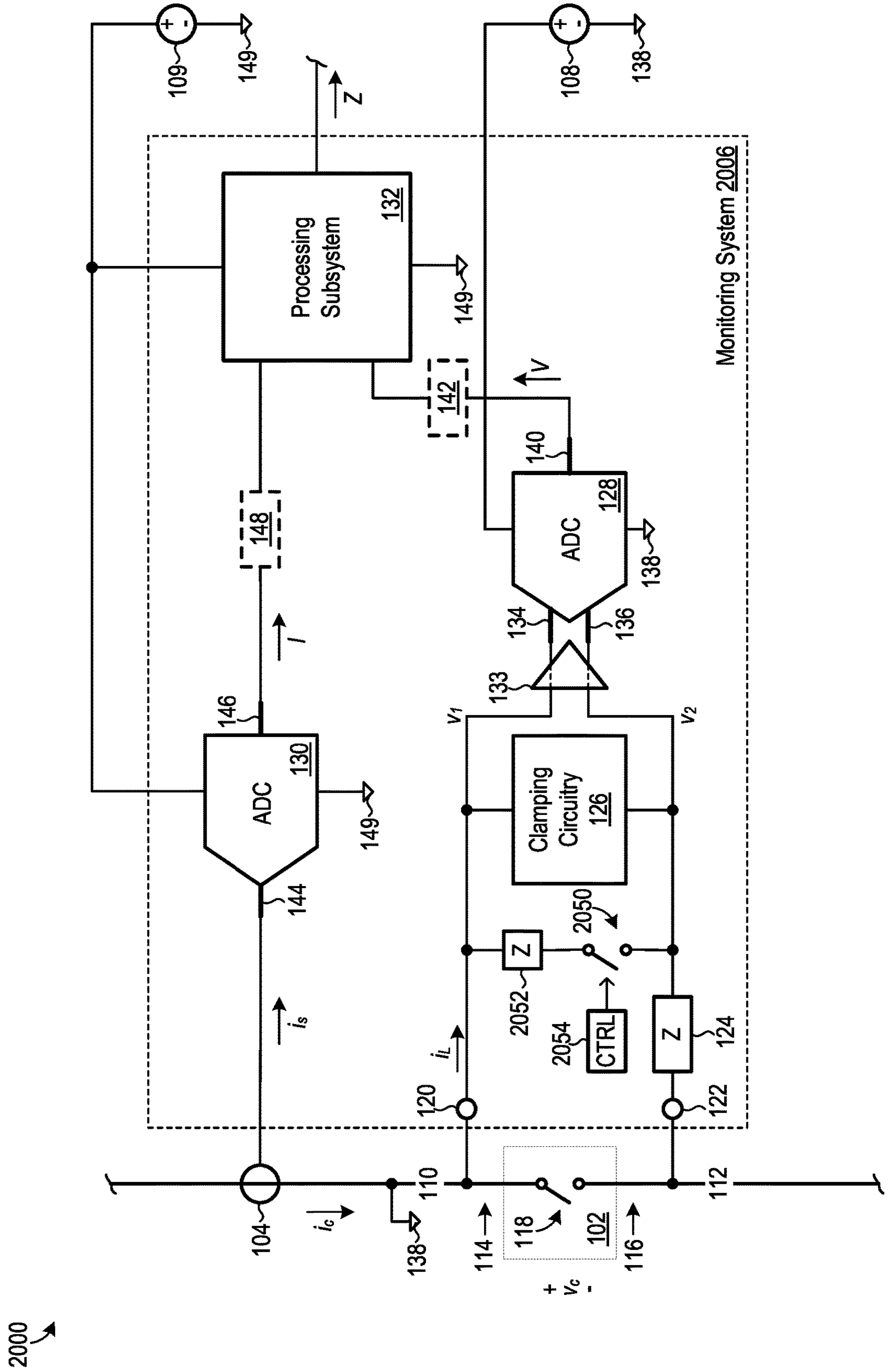
FIG. 20 is a schematic diagram of an alternate embodiment of the FIG. 1 electrical environment including a monitoring system supporting two different divide ratios.

The above-discussed monitoring systems could be modified to support multiple divide ratios, such as to facilitate sensing voltage $v_c$ across electrical connection device 102 when electrical connection device 102 is open, as well as to facilitate sensing voltage $v_c$ across electrical connection device 102 when electrical connection device 102 is closed. For example, FIG. 20 is a schematic diagram of an electrical environment 2000, which is an alternate embodiment of electrical environment 100 (FIG. 1) where monitoring system 106 is replaced with a monitoring system 2006. Monitoring system 2006 differs from monitoring system 106 in that monitoring system 2006 further includes a switching device 2050, an additional impedance element 2052, and a controller 2054. Switching device 2050 and impedance element 2052 are electrically coupled in series between (a) first input port 134 of ADC 128 via buffer 133 and (b) second input port 136 of ADC 128 via buffer 133. Switching device 2050 includes, for example, one or more transistors (e.g., two FETs electrically coupled in series with opposing body diode orientations), an electromechanical relay, a solid-state relay, or a MEMS switch. The topological positions of switching device 2050 and additional impedance element 2052 could be swapped without departing from the scope hereof.

Controller 2054 is configured to control switching device 2050 such that (a) switching device 2050 is closed when electrical connection device 102 is open and (b) switching device 2050 is open when electrical connection device 102 is closed. Additionally, impedance element 124 and additional impedance element 2052 are selected such that a divide ratio (discussed above with respect to FIG. 1) of monitoring system 2006 is high, e.g., greater than or equal to 1,000, when switching device 2050 is closed. Additionally, impedance element 124 is further selected such that the divide ratio of monitoring system 2006 is low, e.g., less than 1,000, when switching device 2050 is open. Consequently, monitoring system 2006 has a small divide ratio when electrical connection device 102 is closed, thereby facilitating ADC 128's ability to sample a small value of voltage $v_c$ resulting from electrical connection device 102 being closed. Additionally, monitoring system 2006 has a large divide ratio when electrical connection device 102 is open, which advantageously attenuates a potentially large magnitude of voltage $v_c$ to prevent damage to ADC 128 and/or buffer 133 from high voltage. It may be desirable to sample voltage $v_c$ when electrical connection device 102 is controlled to be in an open state, for example, to ensure that electrical connection device 102 device has not been bypassed or that electrical connection device 102 has not failed in a closed state. Certain embodiment of monitoring system 2006 further include circuitry (not shown) to measure voltage at first power node 110 relative to an earth ground or another electrical power system reference node. Additionally, some embodiments of monitoring system 2006 are capable of determining power supplied to a load electrically coupled to second power node 112.

Figure 22:
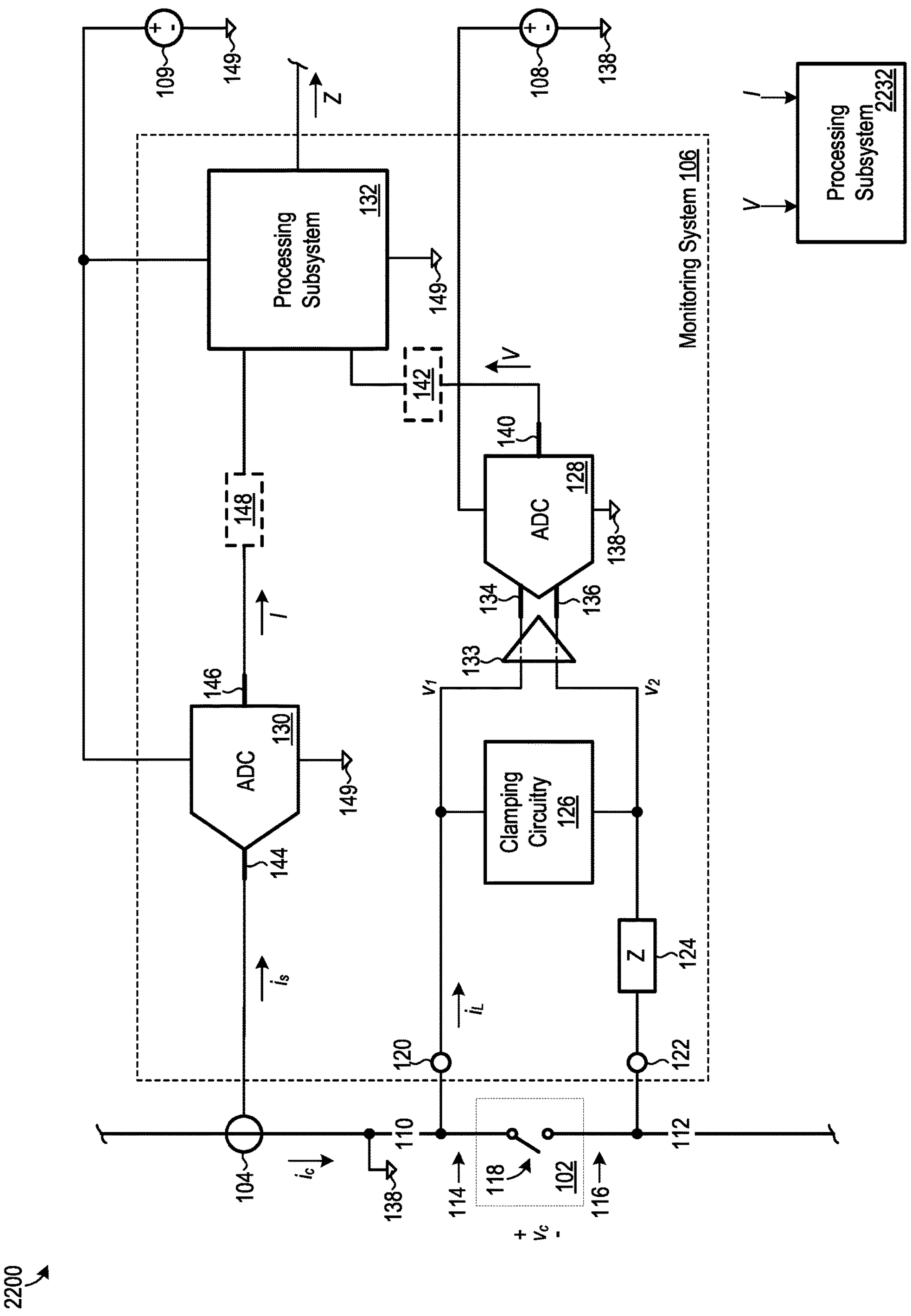
FIG. 22 is a schematic diagram of an alternate embodiment of the FIG. 1 electrical environment further including a second processing subsystem.

FIG. 22 is a schematic diagram of an electrical environment 2200, which is an alternate embodiment of electrical environment 100 (FIG. 1) further including a second processing subsystem 2232. Monitoring system 106 is configured to send digital signal V and/or digital signal I to second processing subsystem 2232 for processing. In certain embodiments, processing subsystem 132 is configured to determine impedance of electrical connection device 102, and second processing subsystem 2232 is configured to perform one or more of the additional functions discussed above, such as detecting an overcurrent condition in electrical environment 2200, detecting a short circuit condition in electrical environment 2200, determining power delivered to a load (not shown) electrically coupled to second power node 112, determining energy delivered to a load (not shown) electrically coupled to second power node 112, determining correlation between values of digital signal Z and temperature of electrical connection device 102, etc. Additionally, some embodiments of second processing subsystem 2232 are configured to control an operating state of electrical connection device 102. For example, certain embodiments of second processing subsystem 2232 are configured to cause electrical connection device 102 to open in response to (a) detection of an overcurrent condition in electrical environment 2200 or (b) detection of a short circuit condition in electrical environment 2200. Connections between second processing subsystem 2232 and other elements of electrical environment 2200 are not shown, but such connections could be embodied, for example, by one or more electrical communication links, one or more optical communication links, and/or one or more RF wireless communication links.

Combinations of Features

Features described above may be combined in various ways without departing from the scope hereof. The following examples illustrate some possible combinations.

(A1) A system for monitoring impedance of an electrical connection device includes (1) a first connection port configured to be electrically coupled to a first side of the electrical connection device; (2) a second connection port configured to be electrically coupled to a second side of the electrical connection device, (3) a first impedance element, (4) a first analog-to-digital converter (ADC) including a first input port and a second input port, the first input port being electrically coupled to the first connection port, and the second input port being electrically coupled to the second connection port via the first impedance element, the first ADC configured to generate a first digital signal representing voltage across the electrical connection device, the first ADC being referenced to a reference node configured to be electrically coupled to the first side of the electrical connection device, (5) clamping circuitry electrically coupled to at least one of the first input port and the second input port, the clamping circuitry being configured to limit magnitude of voltage at one or more of the first input port and the second input port; and (6) a processing subsystem configured to determine impedance of the electrical connection device at least partially based on (a) the first digital signal representing voltage across the electrical connection device and (b) a second digital signal representing current flowing through the electrical connection device.

(A2) The system denoted as (A1) may further include a second ADC configured to generate the second digital signal representing current flowing through the electrical connection device from an analog signal representing current flowing through the electrical connection device.

(A3) Either one of the systems denoted as (A1) and (A2) may further include a buffer electrically coupled to each of the first input port and the second input port.

(A4) In any one of the systems denoted as (A1) through (A3), the clamping circuitry may include a diode electrically coupled to the second input port.

(A5) In any one of the systems denoted as (A1) through (A3), the clamping circuitry may include a first diode and a second diode, a cathode of the first diode being electrically coupled to the first input port, and an anode of the second diode being electrically coupled to the first input port.

(A6) In the system denoted as (A5), an anode of the first diode may be electrically coupled to the second input port, and a cathode of the second diode may be electrically coupled to the second input port.

(A7) In any one of the systems denoted as (A1) through (A3), the clamping circuitry may include a Zener diode.

(A8) In any one of the systems denoted as (A1) through (A3), the clamping circuitry may include a metal oxide varistor (MOV).

(A9) In any one of the systems denoted as (A1) through (A3), the clamping circuitry may include a switching device configured to close in response to opening of the electrical connection device.

(A10) In any one of the systems denoted as (A1) through (A3), the clamping circuitry may include (1) a first diode including a cathode electrically coupled to the first input port and an anode electrically coupled to a reference node; (2) a second diode including an anode electrically coupled to the first input port and a cathode electrically coupled to the reference node; (3) a third diode including an anode electrically coupled to the second input port and a cathode electrically coupled to the reference node; and (4) a fourth diode including a cathode electrically coupled to the second input port and an anode electrically coupled to the reference node.

(A11) In any one of the systems denoted as (A1) through (A3), the clamping circuitry may include a first diode and a second diode, where the first diode is electrically coupled between the second input port and a power supply for the first ADC, and where the second diode is electrically coupled between the second input port and the reference node.

(A12) In any one of the systems denoted as (A1) through (A11), the first impedance element may be selected from the group consisting of a resistor and a capacitor.

(A13) In any one of the systems denoted as (A1) through (A11), the first impedance element may include a switching device configured to open in response to opening of the electrical connection device.

(A14) In any one of the systems denoted as (A1) through (A13), the electrical connection device may be selected from the group consisting of a circuit breaker and a plug and socket assembly.

(A15) In any one of the systems denoted as (A1) through (A14), the first impedance element may have an impedance such that a divide ratio of the monitoring system is less than 1,000, the divide ratio being a ratio of (a) magnitude of the voltage across the electrical connection device and (b) magnitude of a voltage sampled by the first ADC to generate the first digital signal representing voltage across the electrical connection device.

(A16) Any one of the systems denoted as (A1) through (A15) may further include a switching device and an additional impedance element electrically coupled in series between the first input port and the second input port, where the system is configured such that (a) the switching device is closed when the electrical connection device is open, and (b) the switching device is open when the electrical connection device is closed.

(A17) In any one of the systems denoted as (A1) through (A16), the processing subsystem may be further configured to (a) detect occurrence of an overcurrent condition in an electrical environment including the system, and (b) in response to detecting occurrence of the overcurrent condition, cause the electrical connection device to open.

(A18) In any one of the systems denoted as (A1) through (A17), the system may be configured to send one or more of (a) the first digital signal representing voltage across the electrical connection device, and (b) the second digital signal representing current flowing through the electrical connection device, to a second processing subsystem.

(A19) In any one of the systems denoted as (A1) through (A18), the processing subsystem may be further configured to determine power delivered to a load.

(B1) A system for monitoring impedance of an electrical connection device includes (1) a first connection port configured to be electrically coupled to a first side of the electrical connection device; (2) a second connection port configured to be electrically coupled to a second side of the electrical connection device; (3) an analog-to-digital converter (ADC) including a first input port, a second input port, and an output port; (4) a first impedance element electrically coupled between the first connection port and the first input port; (5) a second impedance element electrically coupled between the first input port and a reference node; (6) a third impedance element electrically coupled between the second connection port and the second input port; (7) a fourth impedance element electrically coupled between the second input port and the reference node; and (8) a processing subsystem communicatively coupled to the output port, the processing subsystem being configured to calculate the impedance of the electrical connection device from (a) first and second digital signals received from the output port and representing voltage across the electrical connection device at first and second times, respectively, and (b) first and second digital signals representing current flowing through the electrical connection device at the first and second times, respectively.

(B2) In the system denoted as (B1), the first and second impedance elements may be collectively configured to divide-down a voltage at the first side of the electrical connection device to a first voltage at the first input port, and the third and fourth impedance elements may be collectively configured to divide-down a voltage at the second side of the electrical connection device to a second voltage at the second input port.

(B3) In either one of the systems denoted as (B1) and (B2), the electrical connection device may be selected from the group consisting of a circuit breaker and a plug and socket assembly.

(B4) Any one of the systems denoted as (B1) through (B3) may further include a second ADC configured to generate the first and second digital signals representing current flowing through the electrical connection device at the first and second times, respectively.

(B5) In any one of the systems denoted as (B1) through (B4), the processing subsystem may be further configured to (a) detect occurrence of an overcurrent condition in an electrical environment including the system, and (b) in response to detecting occurrence of the overcurrent condition, cause the electrical connection device to open.

(B6) In any one of the systems denoted as (B1) through (B5), the system may be configured to send one or more of (a) the first and second digital signals received from the output port and representing voltage across the electrical connection device at the first and second times, respectively, and (b) the first and second digital signals representing current flowing through the electrical connection device at the first and second times, respectively, to a second processing subsystem.

(B7) In any one of the systems denoted as (B1) through (B6), the processing subsystem may be further configured to determine power delivered to a load.

(C1) A system for monitoring impedance of an electrical connection device, including (1) a first connection port configured to be electrically coupled to a first side of the electrical connection device; (2) a second connection port configured to be electrically coupled to a second side of the electrical connection device; (3) a first analog-to-digital converter (ADC) including a first input port and a first output port; (4) a second ADC including a second input port and a second output port, the first ADC and the second ADC being referenced to a common reference node; (5) a first impedance element electrically coupled between the first connection port and the first input port; (6) a second impedance element electrically coupled between the first input port and a reference node; (7) a third impedance element electrically coupled between the second connection port and the second input port; (8) a fourth impedance element electrically coupled between the second input port and the reference node; and (9) a processing subsystem communicatively coupled to each of the first output port and the second output port, the processing subsystem configured to calculate the impedance of the electrical connection device from (a) first and second digital signals received from the first output port and representing a voltage at the first side of the electrical connection device at first and second times, respectively, (b) first and second digital signals received from the second output port and representing a voltage at the second side of the electrical connection device at the first and second times, respectively, and (c) first and second digital signals representing current flowing through the electrical connection device at the first and second times, respectively.

(C2) In the system denoted as (C1), the first and second impedance elements may be collectively configured to divide-down the voltage at the first side of the electrical connection device to a first voltage at the first input port, and the third and fourth impedance elements may be collectively configured to divide-down a voltage at the second side of the electrical connection device to a second voltage at the second input port.

(C3) In either one of the systems denoted as (C1) and (C2), the electrical connection device may be selected from the group consisting of a circuit breaker and a plug and socket assembly.

(C4) In any one of the systems denoted as (C1) through (C3), the processing subsystem may be further configured to determine power delivered to a load.

(C5) In any one of the systems denoted as (C1) through (C4), the processing subsystem may be further configured to (a) detect occurrence of an overcurrent condition in an electrical environment including the system, and (b) in response to detecting occurrence of the overcurrent condition, cause the electrical connection device to open.

(C6) In any one of the systems denoted as (C1) through (C5), the system may be configured to send one or more of (a) the first and second digital signals received from the first output port and representing the voltage at the first side of the electrical connection device at first and second times, respectively, (b) the first and second digital signals received from the second output port and representing the voltage at the second side of the electrical connection device at the first and second times, respectively, and (c) the first and second digital signals representing current flowing through the electrical connection device at the first and second times, respectively (C7) Any one of the systems denoted as (C1) through (C6) may further include a second ADC configured to generate the first and second digital signals representing current flowing through the electrical connection device at the first and second times, respectively.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which as a matter of language, might be said to fall therebetween.

What is claimed is:

1. A system for monitoring impedance of an electrical connection device, the system comprising:

a first connection port configured to be electrically coupled to a first side of the electrical connection device;

a second connection port configured to be electrically coupled to a second side of the electrical connection device;

a first impedance element;

a first analog-to-digital converter (ADC) including a first input port and a second input port, the first input port being electrically coupled to the first connection port, and the second input port being electrically coupled to the second connection port via the first impedance element, the first ADC configured to generate a first digital signal representing voltage across the electrical connection device, the first ADC being referenced to a reference node configured to be electrically coupled to the first side of the electrical connection device;

clamping circuitry electrically coupled to at least one of the first input port and the second input port, the clamping circuitry being configured to limit magnitude of voltage at one or more of the first input port and the second input port; and a processing subsystem configured to determine impedance of the electrical connection device at least partially based on (a) the first digital signal representing voltage across the electrical connection device and (b) a second digital signal representing current flowing through the electrical connection device.

2. The system of claim 1, further comprising a second ADC configured to generate the second digital signal representing current flowing through the electrical connection device from an analog signal representing current flowing through the electrical connection device.

3. The system of claim 1, further comprising a buffer electrically coupled to each of the first input port and the second input port.

4. The system of claim 1, wherein the first impedance element is selected from the group consisting of a resistor and a capacitor.

5. The system of claim 1, wherein the first impedance element comprises a switching device configured to open in response to opening of the electrical connection device.

6. The system of claim 1, wherein the electrical connection device is selected from the group consisting of a circuit breaker and a plug and socket assembly.

7. The system of claim 1, wherein the first impedance element has an impedance such that a divide ratio of the monitoring system is less than 1,000, the divide ratio being a ratio of (a) magnitude of the voltage across the electrical connection device and (b) magnitude of a voltage sampled by the first ADC to generate the first digital signal representing voltage across the electrical connection device.

8. The system of claim 1, further comprising a switching device and an additional impedance element electrically coupled in series between the first input port and the second input port, the system being configured such that (a) the switching device is closed when the electrical connection device is open, and (b) the switching device is open when the electrical connection device is closed.

9. The system of claim 1, wherein the processing subsystem is further configured to (a) detect occurrence of an overcurrent condition in an electrical environment including the system, and (b) in response to detecting occurrence of the overcurrent condition, cause the electrical connection device to open.

10. The system of claim 1, wherein the system is configured to send one or more of (a) the first digital signal representing voltage across the electrical connection device, and (b) the second digital signal representing current flowing through the electrical connection device, to a second processing subsystem.

11. The system of claim 1, wherein the processing subsystem is further configured to determine power delivered to a load.

* * * * *